(12) United States Patent
Hsieh

(10) Patent No.: US 8,759,910 B2
(45) Date of Patent: Jun. 24, 2014

(54) TRENCH MOSFET WITH TRENCHED FLOATING GATES HAVING THICK TRENCH BOTTOM OXIDE AS TERMINATION

(71) Applicant: Force Mos Technology Co., Ltd., New Taipei (TW)

(72) Inventor: Fu-Yuan Hsieh, New Taipei (TW)

(73) Assignee: Force Mos Technology Co., Ltd., New Taipei (TW)

( * ) Notice: Subject to any disclaimer, the term of this patent is extended or adjusted under 35 U.S.C. 154(b) by 0 days.

(21) Appl. No.: 13/953,099

(22) Filed: Jul. 29, 2013

(65) Prior Publication Data

US 2013/0307066 A1 Nov. 21, 2013

Related U.S. Application Data

(63) Continuation-in-part of application No. 13/171,965, filed on Jun. 29, 2011, now Pat. No. 8,525,255, which is a continuation-in-part of application No. 12/591,467, filed on Nov. 20, 2009, now Pat. No. 7,989,887.

(51) Int. Cl.
*H01L 29/78* (2006.01)

(52) U.S. Cl.
USPC ......... 257/330; 257/331; 257/334; 257/315; 257/E29.262; 257/E21.41

(58) Field of Classification Search
USPC ............... 257/330, 331, 334, 315, E29.262, 257/E21.41
See application file for complete search history.

(56) References Cited

U.S. PATENT DOCUMENTS 8,525,255 B2 * 9/2013 Hsieh ............................ 257/330

* cited by examiner

*Primary Examiner* — Long Pham
(74) *Attorney, Agent, or Firm* — Bacon & Thomas, PLLC

(57) ABSTRACT

A semiconductor power device with trenched floating gates having thick bottom oxide as termination is disclosed. The gate charge is reduced by forming a HDP oxide layer padded by a thermal oxide layer on trench bottom and a top surface of mesa areas between adjacent trenched gates. Therefore, only three masks are needed to achieve the device structure.

8 Claims, 28 Drawing Sheets

US 8,759,910 B2

TRENCH MOSFET WITH TRENCHED FLOATING GATES HAVING THICK TRENCH BOTTOM OXIDE AS TERMINATION

CROSS REFERENCE TO RELATED APPLICATIONS

This application is a Continuation-In-Part (CIP) of U.S. patent application Ser. No. 13/171,965 of the same inventor, filed on Jun. 29, 2011, entitled "trench MOSFET with trenched floating gates having thick trench bottom oxide as termination".

FIELD OF THE INVENTION

This invention relates generally to the cell structure, device configuration and fabricating method of semiconductor power devices. More particularly, this invention relates to configuration and fabricating method of an improved trench MOSFET (Metal Oxide Semiconductor Field Effect Transistor, the same hereinafter) having thick trench bottom oxide and multiple trenched floating gates in termination area.

BACKGROUND OF THE INVENTION

In field of semiconductor power devices, it is desirable to further reduce Qgd (charge between gate and drain) for less power consumptions and higher switching speed, for a trench MOSFET, such purposes are generally achieved by implementing a thick trench bottom oxide in trenched gates of the trench MOSFET. Meanwhile, it is also desirable to simplify the manufacturing processes in forming the trench MOSFET having thick trench bottom oxide mentioned above for requirement of mass-production.

FIG. 1 shows a trench MOSFET 100 of prior art having thick trench bottom oxide disclosed in U.S. Patent No. 20080265289 which has a high-density plasma (HDP, the same hereinafter) CVD oxide 115 on bottom of trenched gates for reduction of Qgd, and has a HDP oxide 120 on top surface of mesa area between adjacent trenched gates as implanting-ion block mask for saving body and source masks during manufacturing processes. However, the trench MOSFET 100 and the manufacturing method of prior art still encounter difficulties and limitations for device shrinkage and gate charge reduction. First, a high interface state gate charge is induced between the HDP oxide 115 and the bottom of the trenched gates. Second, planar source-body contact structure is used in the trench MOSFET 100 of prior art, limiting device cell shrinkage as the planar source-body contact occupying large space and causing poor contact performance. Furthermore, a trade-off between a space Sbs (the space defining P body and n+ source regions, as illustrated in FIG. 1) and thickness of the HDP oxide 115 causes a difficulty in optimization of device performance because the both are determined by wet etching time for removal of trenched gates sidewall oxide in manufacturing processes. The longer Sbs, the thinner the HDP 115 resulting in higher Qgd; the shorter Sbs, the less n+ source regions formed into the P body regions resulting in less contact area to source metal 160, leading to high contact resistance and poor contact performance.

Besides, the source metal 160 and gate metal 106 must keeps a space of at least 3.0 um to avoid metal bridging issue during metal etching process. In order to form an inverted V shape P body profile in middle of two adjacent trenched gates, the junction depth of the P body regions must be kept greater than 1.0 um along the trenched gates, causing high gate charge Qg. On the other hand, if the P body regions have shallow junction depth, the termination area (as illustrated in FIG. 1) will not work because the P body region in the termination area can not connect to the P body region in the active area (as illustrated in FIG. 1).

Meanwhile, near the trenched gate in gate contact area, which is positioned between the termination area and the active area, additional parasitic bipolar transistor with floating n+ source regions is built, causing poor avalanche capability because the parasitic bipolar transistor is easily turned on. Moreover, the termination area comprises guard rings having separated P body regions, which will result in early breakdown in middle of two adjacent trenched gates during the trench MOSFET 100 is reverse biased.

Accordingly, it would be desirable to provide a new and improved configuration and fabricating method for a semiconductor power device having low gate charge, high breakdown voltage and reduced cell pitch without complicating the process technology.

SUMMARY OF THE INVENTION

It is therefore an object of the present invention to provide a new and improved semiconductor power device such as a trench MOSFET with better performance than prior art by offering a semiconductor power device comprising: a plurality of transistor cells disposed in an active area near a top surface of an epitaxial layer of a first conductivity type grown on a semiconductor substrate of the first conductivity type wherein each of the transistor cells is surrounded by trenched gates, the trenched gates penetrating through body regions of a second conductivity type and extending into the epitaxial layer; multiple trenched floating gates disposed in a termination area surrounding the active area and each of the trenched floating gates having a floating voltage wherein the trenched floating gates penetrating through the body regions and extending into the epitaxial layer; the body regions formed near the top surface of the epitaxial layer; the trenched gates further extending into at least one wider trenched gate in a gate contact area having a greater trench width than the trenched gates in the active area for electrically contacting to a gate metal; a plurality of source regions of the first conductivity type surrounding the trenched gates in the transistor cells in the active area, but not in the termination area and the gate contact area; a HDP oxide layer padded with a thermal oxide layer formed on bottom surfaces of the trenched gates, the at least one wider trenched gate and the trenched floating gates and a top surface of mesa areas between adjacent the trenched gates the at least one wider trenched gate and the trenched floating gates; and a plurality of trenched source-body contact structures penetrating through a contact interlayer, the HDP oxide layer, the thermal oxide layer and the source regions, and extending into the body regions in the transistor cells, each of the trenched source-body contact structures filled with a contact metal plug for electrically connecting the source region and the body region to a source metal. Therefore, no additional parasitic bipolar transistor is built near the wider trenched gate in the gate contact area, better UIS (Unclamped Inductive Switching, the same hereinafter) performance is achieved. Moreover, the trenched source-body contact structures are better than the planar source-body contacts for die size shrinkage.

It is another object of the present invention to provide a semiconductor power device further comprising at least one UIS enhancement region of the second conductivity type formed under the trenched source-body contact structures in the transistor cells.

It is another object of the present invention to provide a semiconductor power device further comprising at least one trenched gate contact structure penetrating through the contact interlayer and extending into the wider trenched gate, wherein the trenched gate contact structure is filled with the contact metal plug. In some preferred embodiment, the contact metal plug can be implemented by a tungsten plug padded by a barrier metal layer of Ti/TiN or Co/TiN or Ta/TiN.

It is another object of the present invention to provide a semiconductor power device further comprising a ohmic body contact region of the second conductivity type formed at least wrapping around each bottom of the trenched source-body contact structures, the ohmic body contact region having a doping concentration higher than the body regions.

It is another object of the present invention to provide a semiconductor power device wherein the source regions have a doping concentration along the trenched source-body contact structures higher than along adjacent channel regions at a same distance from the top surface of the epitaxial layer, and the source regions have a junction depth along the trenched source-body contact structures deeper than along the adjacent channel regions. In some preferred embodiments, the transistor cells are N-channel MOSFET cells. As an alternative, in some other preferred embodiments, the transistor cells are P-channel MOSFET cells.

This invention further discloses a method for manufacturing a semiconductor power device comprising the steps of: forming a plurality of trenches in an epitaxial layer of a first conductivity type by using a trench mask; depositing a HDP oxide layer on sidewalls and bottoms of the trenches and a top surface of mesa areas between the trenches; removing the HDP oxide layer on the sidewalls of the trenches completely; forming a gate oxide layer; depositing and then etching back or CMP a doped poly-silicon layer to form trenched gates in an active area, at least one wider trenched gate in a gate contact area and trenched floating gates in a termination area; forming body regions of a second conductivity type between adjacent the trenched gates, the at least one wider trenched gate and the trenched floating gates; depositing a contact interlayer on a top surface of the semiconductor power device; forming contact openings in the contact interlayer and the HDP oxide layer by using a contact mask; and forming source regions by ion implantation through the contact openings without a source mask. Therefore, the new device structures make process simple without requiring an additional photolithography or mask to remove the HDP oxide layer on the top surface of the mesa areas between the trenches, only three masks are used to achieve the device structure, further lowering the manufacturing cost.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

In the following Detailed Description, reference is made to the accompanying drawings, .which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
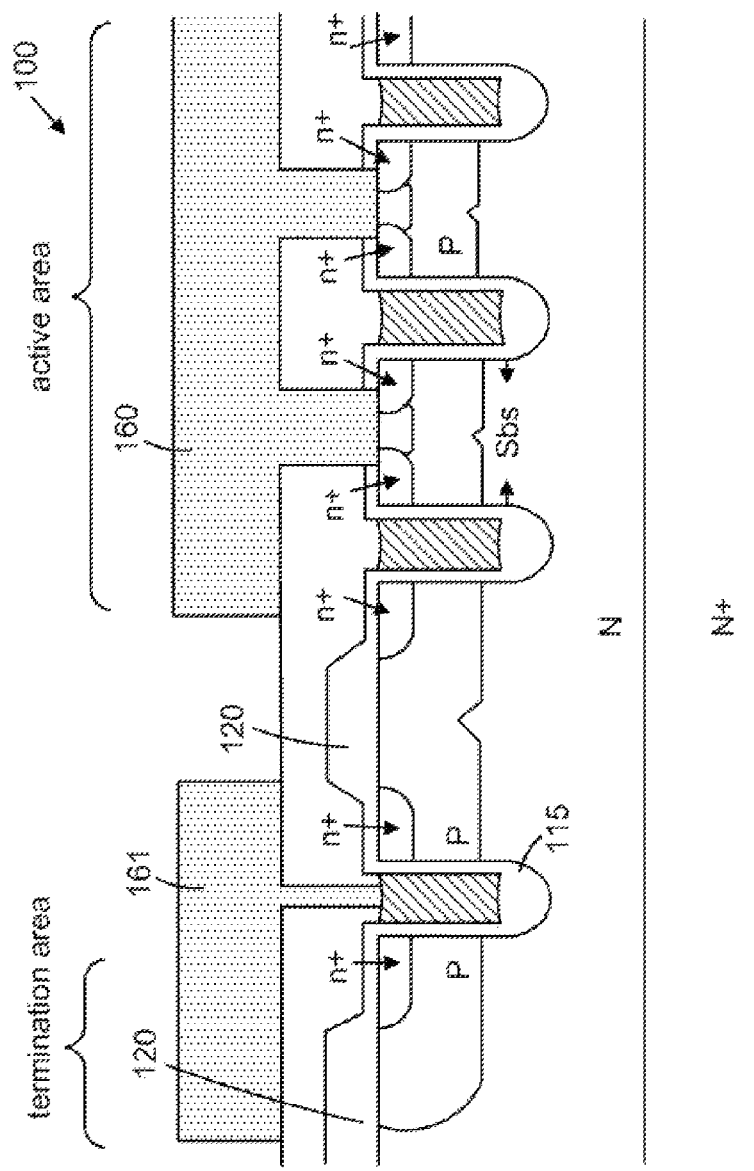
FIG. 1 is a cross-sectional view of a trench MOSFET of prior art.
Figure 2A:
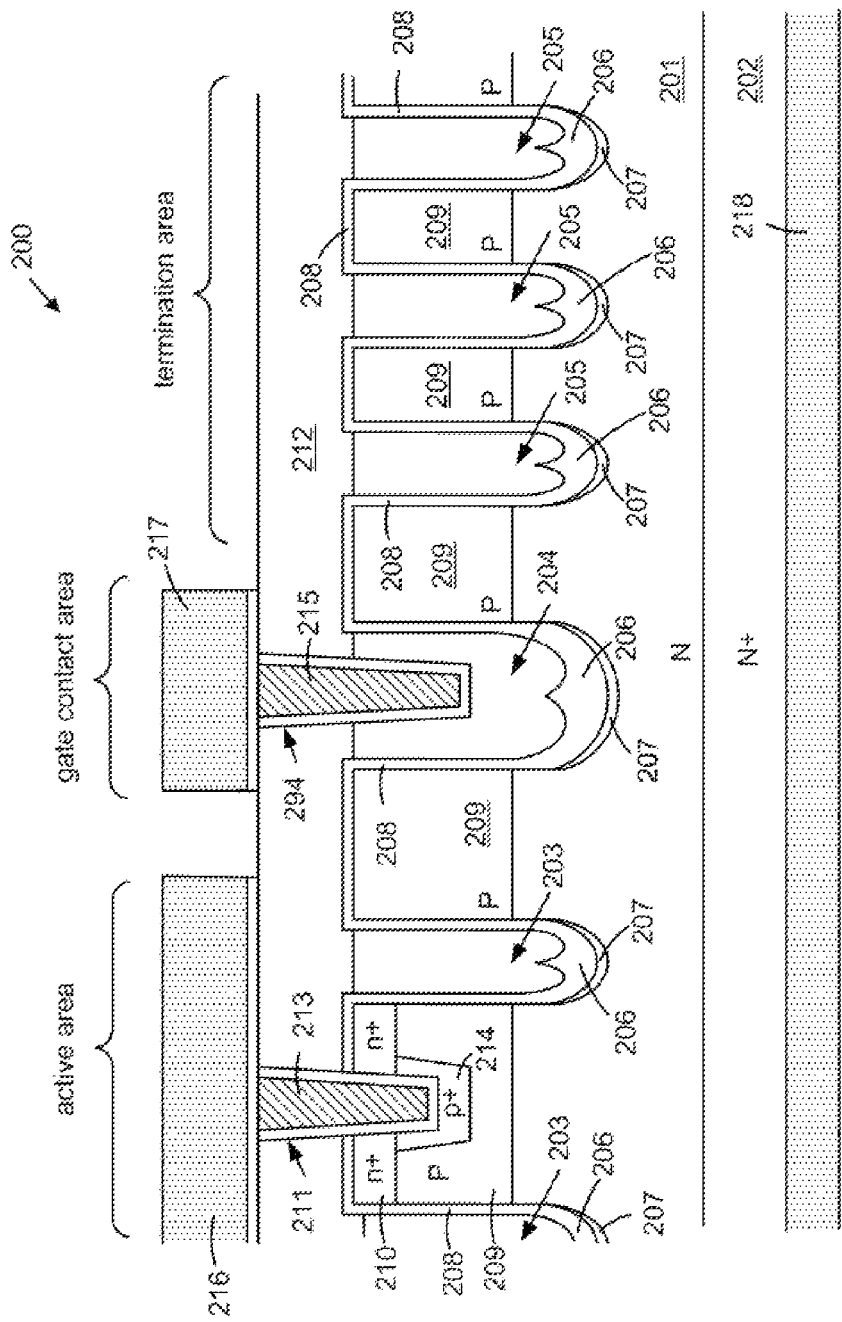
FIG. 2A is a cross-sectional view of a preferred embodiment according to the present invention.

Please refer to FIG. 2A for a preferred N-channel trench MOSFET 220 with composite oxide as trench bottom oxide for reduced gate charge according to the present invention. The N-channel trench MOSFET 200 is formed in an N epitaxial layer 201 supported on a heavily doped N+ substrate 202 which coated with back metal 218 on a rear side as drain electrode, in some preferred embodiment, the N+ substrate 202 can be implemented by using a red phosphorus substrate. A plurality of trenched gates are formed extending from a top surface of the N epitaxial layer 201, among those trenched gates, including: a plurality of trenched gates 203 in an active area, at least one wider trenched gate 204 in a gate contact area and multiple trenched floating gates 205 in a termination area, wherein the wider trenched gate 204 has greater trench width than the trenched gates 203. The trenched gates 203, the at least one wider trenched gate 204 and the trenched floating gates 205 are all formed in same manufacturing processes and filled with doped poly-silicon layer onto a composite trench bottom oxide, wherein the composite trench bottom oxide: a HDP oxide layer 206 on bottom of those trenched gates; a thermal oxide layer 207 underneath and surrounding the HDP oxide layer 206; and a gate oxide layer 208 onto the HDP oxide layer 206, wherein the gate oxide layer 208 is also lining sidewalls of those trenched gates as sidewall oxide. As illustrated in FIG. 2A, the composite trench bottom oxide in conjunction with the sidewall oxide forms a W shape interface with the doped poly-silicon layer filled in those trenched gates. P body regions 209 are extending between two adjacent of those trenched gates while encompassing n+ source region 210 near the top surface of the N epitaxial layer 201 only in the active area, therefore, no additional parasitic bipolar transistor is built near the wider trenched gate 204 in the gate contact area, better UIS performance is achieved. A trenched source-body contact structure 211 having slope sidewalls is penetrating through a contact interlayer 212 lying over the trench MOSFET 200, and further penetrating through the n+ source regions 210 and extending into the P body region 209 between every two adjacent of the trenched gates 203 in the active area, according to FIG. 2A, the trenched source-body contact structure 211 is implemented by having slope sidewalls and filled with tungsten plug 213 padded by a barrier layer of Ti/TiN or Co/TiN or Ta/TiN. The n+ source regions 210 have a uniform doping concentration and a same junction depth between sidewalls of the trenched source-body contact structure 211 and adjacent channel region near the trenched gates 203 at a same distance from the top surface of the N epitaxial layer 201. Underneath the trenched source-body contact structure 211, a p+ ohmic body contact region 214 is formed surrounding bottom and sidewalls of the trenched source-body contact structure 211 within the P body region 209 to further reduce the contact resistance between the tungsten metal plug 213 and the P body region 209, wherein the p+ ohmic body contact region 214 has a higher doping concentration than the P body region 209. In the gate contact area, a trenched gate contact structure 294 formed at same manufacturing processes as the trenched source-body contact structure 211 is penetrating through the contact interlayer 212 and extending into the doped poly-silicon layer within the wider trenched gate 206, the trenched gate contact structure 294 is also having slope sidewalls and filled with tungsten metal plug 215 padded by the barrier layer of Ti/TiN or Co/TiN or Ta/TiN. Onto the contact interlayer 212, a source metal 216 and a gate metal 217 padded by a resistance-reduction layer of Ti or Ti/TiN is formed to be electrically contacting with the tungsten metal plug 213 filled in the trenched source-body contact structure 211, and the tungsten metal plug 215 filled in the trenched gate contact structure 294, respectively, wherein the source metal 216 and the gate metal 217 can be implemented by Al alloys or Cu alloys. In the termination area, the multiple trenched floating gates 205 having floating voltage with P body regions 209 extending there between to further enhance breakdown voltage of the trench MOSFET 200.

Figure 2B:
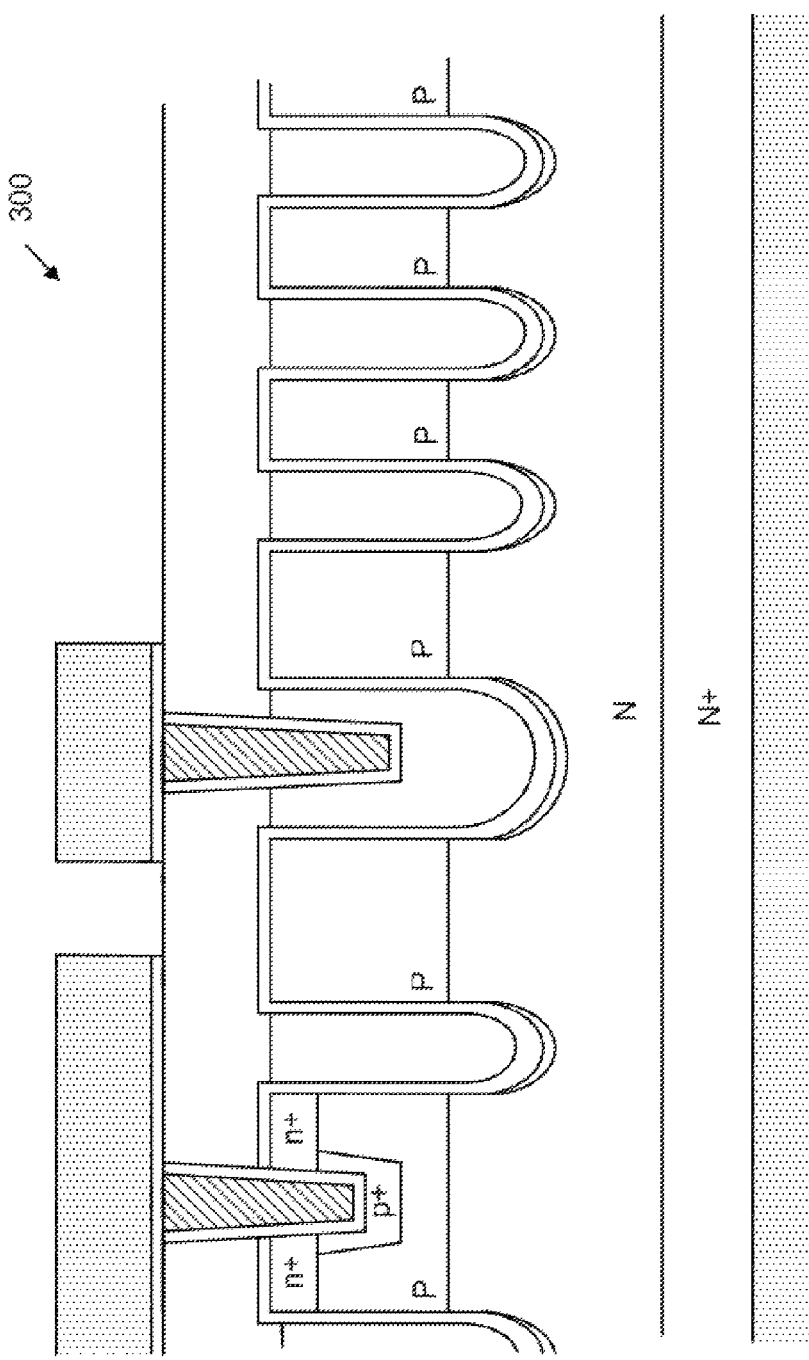
FIG. 2B is a cross-sectional view of another preferred embodiment according to the present invention.

Please refer to FIG. 2B for another preferred N-channel trench MOSFET 300 with composite trench bottom oxide for reduction of gate charge according to the present invention. The N-channel trench MOSFET 300 has a similar structure to the N-channel trench MOSFET 200 in FIG. 2A except that, the composite trench bottom oxide in conjunction with the sidewall oxide forms a U shape interface with the doped poly-silicon layer filled in the trenched gates.

Figure 3A:
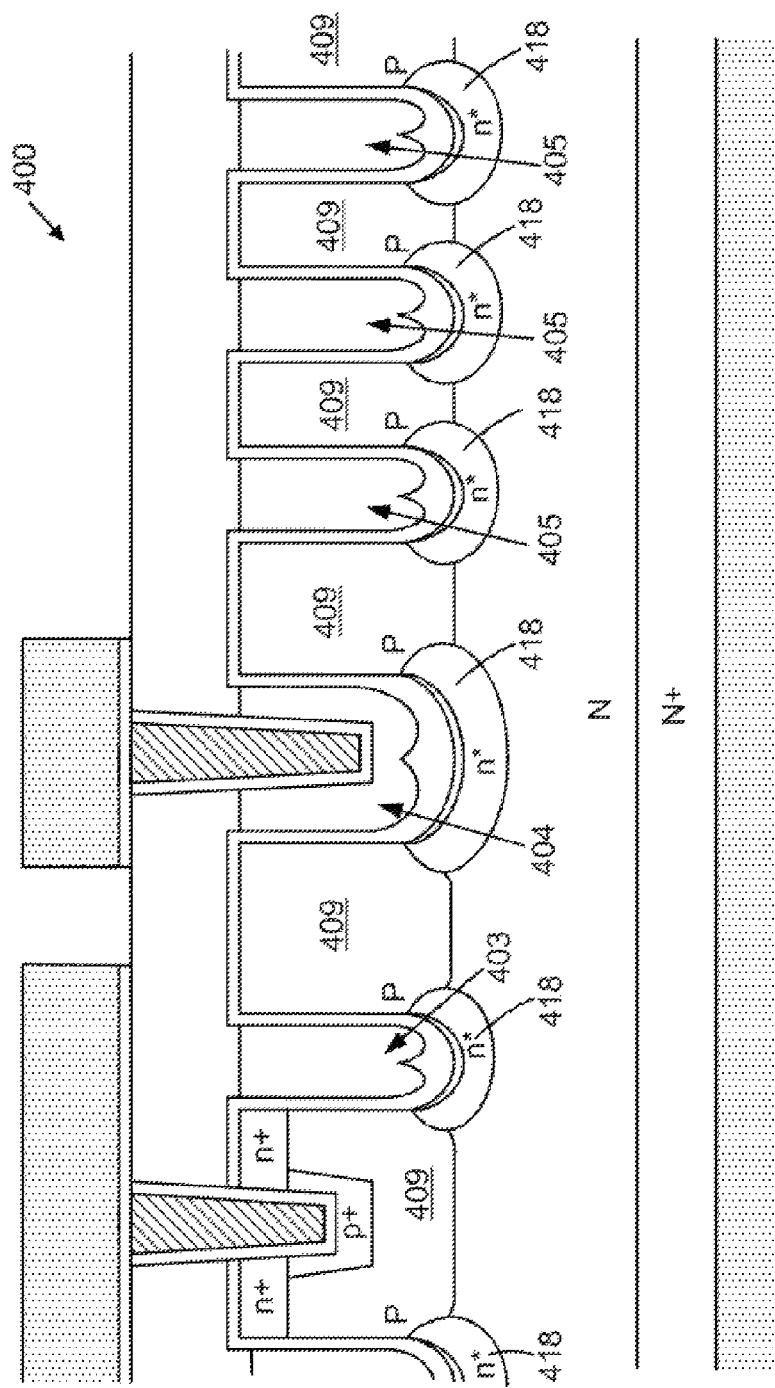
FIG. 3A is a cross-sectional view of another preferred embodiment according to the present invention.

Please refer to FIG. 3A for another preferred N-channel trench MOSFET 400 with composite trench bottom oxide for reduction of gate charge according to the present invention. The N-channel trench MOSFET 400 has a similar structure to the N-channel trench MOSFET 200 in FIG. 2A, except that, there is an n* on-resistance reduction doped region 418 underneath each trenched gate. The n* on-resistance reduction doped region 418 wraps bottom of each of the trenched gates 403, wider trenched gate 404 and trenched floating gates 405 while connecting to the P body regions 409 to further reduce on-resistance of the N-channel trench MOSFET 400.

Figure 3B:
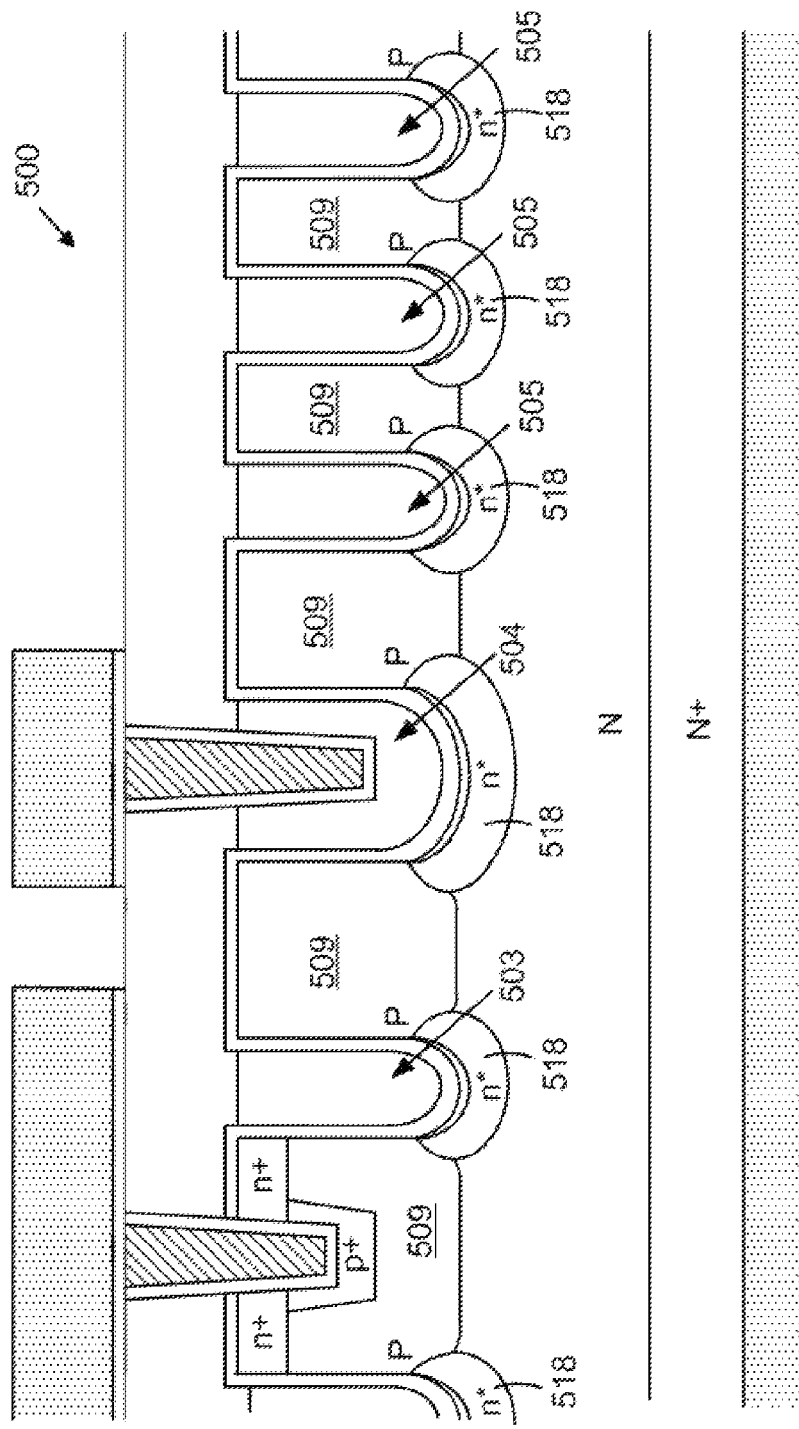
FIG. 3B is a cross-sectional view of another preferred embodiment according to the present invention.

Please refer to FIG. 3B for anther preferred N-channel trench MOSFET 500 with composite trench bottom oxide for reduction of gate charge according to the present invention. The N-channel trench MOSFET 500 has a similar structure to the N-channel trench MOSFET 300 in FIG. 2B, except that, there is an n* on-resistance reduction doped region 518 underneath each of the trenched gates. The n* on-resistance reduction doped region 518 wraps bottom of each of the trenched gates 503, wider trenched gate 504 and trenched floating gates 505 while connecting to the P body regions 509 to further reduce on-resistance of the N-channel trench MOSFET 500.

Figure 4:
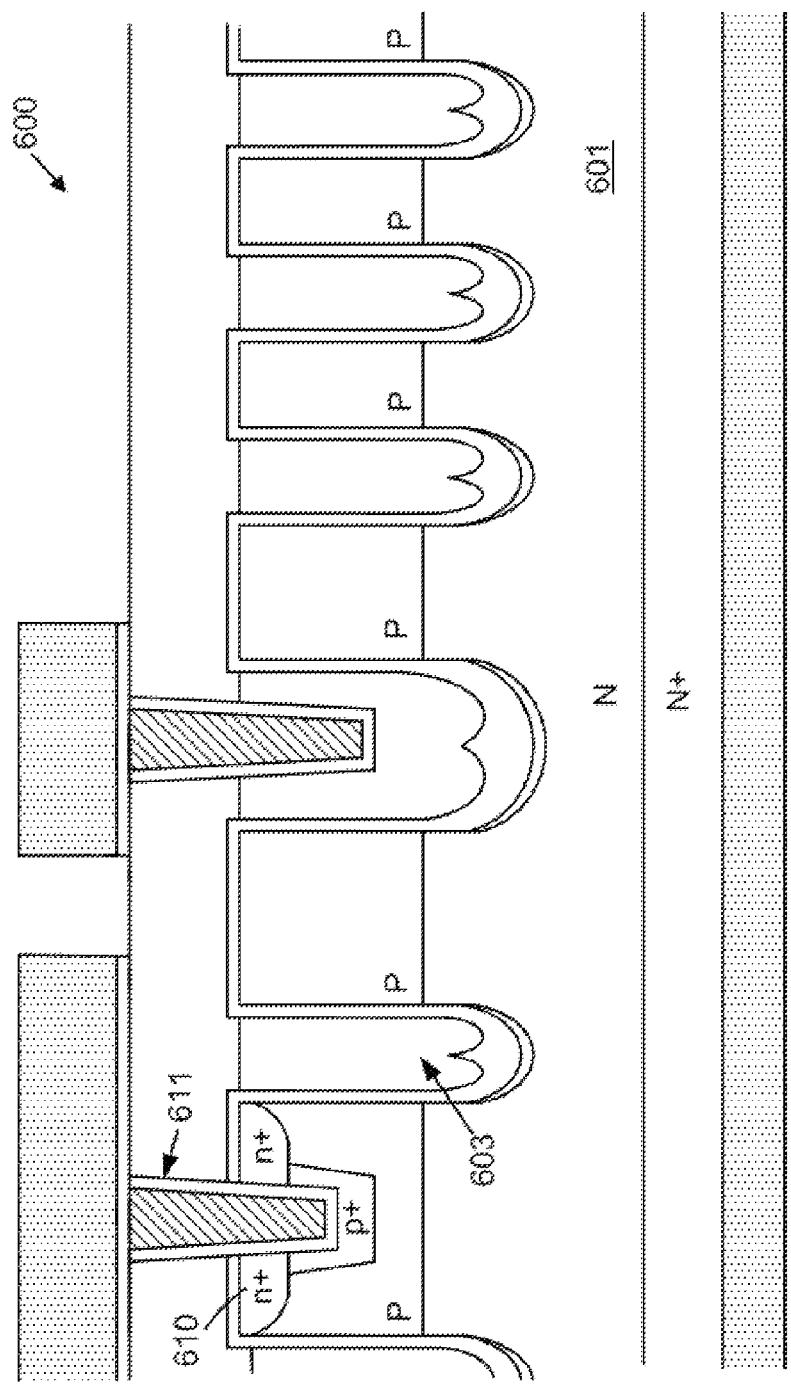
FIG. 4 is a cross-sectional view of another preferred embodiment according to the present invention.

Please refer to FIG. 4 for anther preferred N-channel trench MOSFET 600 with composite trench bottom oxide for reduction of gate charge according to the present invention. The N-channel trench MOSFET 600 has a similar structure to the N-channel trench MOSFET 200 in FIG. 2A, except that, the n+ source regions 610 have a doping concentration along sidewalls of the trenched source-body contact structure 611 higher than along adjacent channel regions near the trenched gates 603 at a same distance from a top surface of the N epitaxial layer 601, and have a junction depth along the sidewalls of the trenched source-body contact structure 611 deeper than along the adjacent channel regions near the trenched gates 603 at the same distance from the top surface of the N epitaxial layer 601.

Figure 5A:
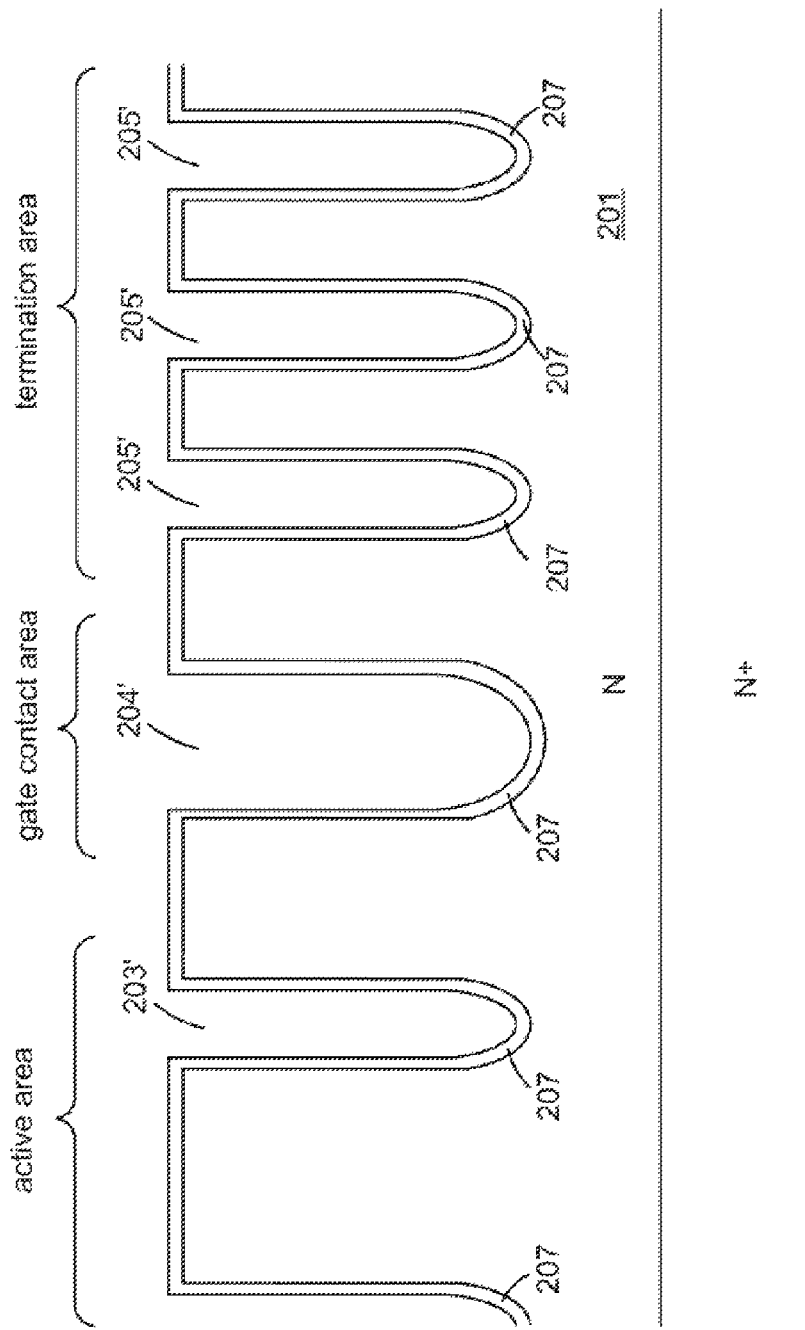
FIGS. 5A~5I are a serial of side cross-sectional views for showing the processing steps for fabricating the trench MOSFET as shown in FIG. 2A.

FIGS. 5A to 5I are a serial of exemplary steps that are performed to form the preferred N-channel trench MOSFET 200 in FIG. 2A by using four masks. In FIG. 5A, an N epitaxial layer 201 is grown on an N+ substrate 202, for example, a red phosphorus substrate. Then, after applying a trench mask (not shown) onto the N epitaxial layer 201, a step of silicon etching is performed to form a plurality of trenches extending from a top surface of the N epitaxial layer 201, including: a plurality of trenches 203' in an active area, at least one wider trench 204' in a gate contact area and multiple floating trenches 205' in a termination area, among those trenches, the wider trench 204' in the gate contact area has a trench width greater than the trenches 203' in the active area. After that, a sacrificial oxide layer (not shown) is applied and then removed to eliminate the plasma damage introduced while etching those trenches. Then, a thermal oxide layer 207 is formed along sidewalls and bottoms of all the trenches and lining the top surface of the N epitaxial layer 201.

Figure 5B:
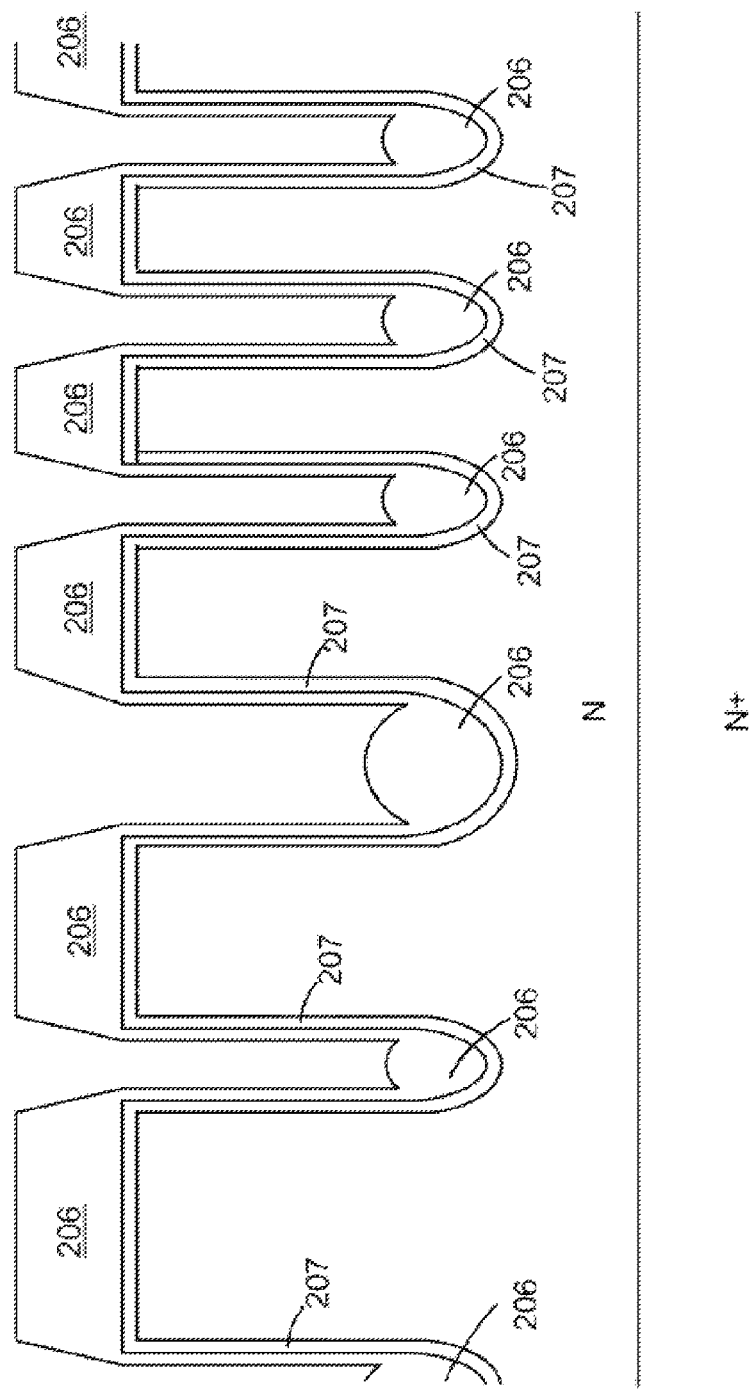
Figure 5C:
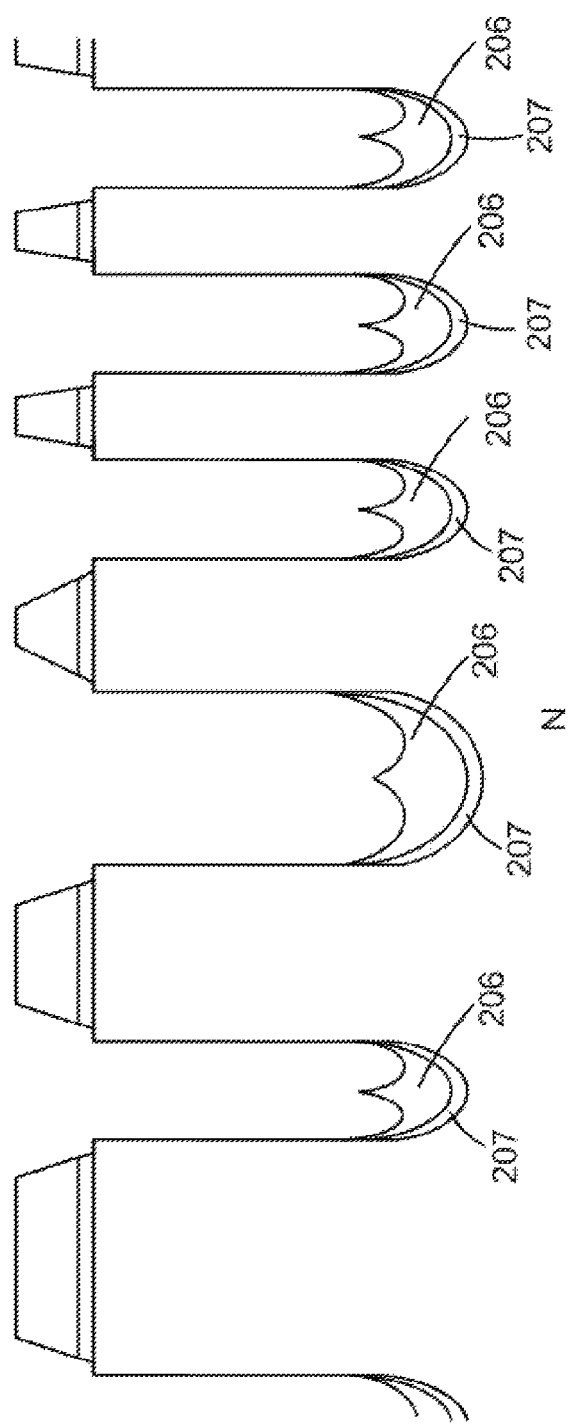

In FIG. 5B, a HDP oxide layer 206 is deposited onto the thermal oxide layer 207. In FIG. 5C, a wet oxide etching is carried out to remove the oxide layer on trench sidewalls of all the trenches, including the portion of the thermal oxide layer 206 and the HDP oxide layer 207 on trench sidewalls.

Figure 5D:
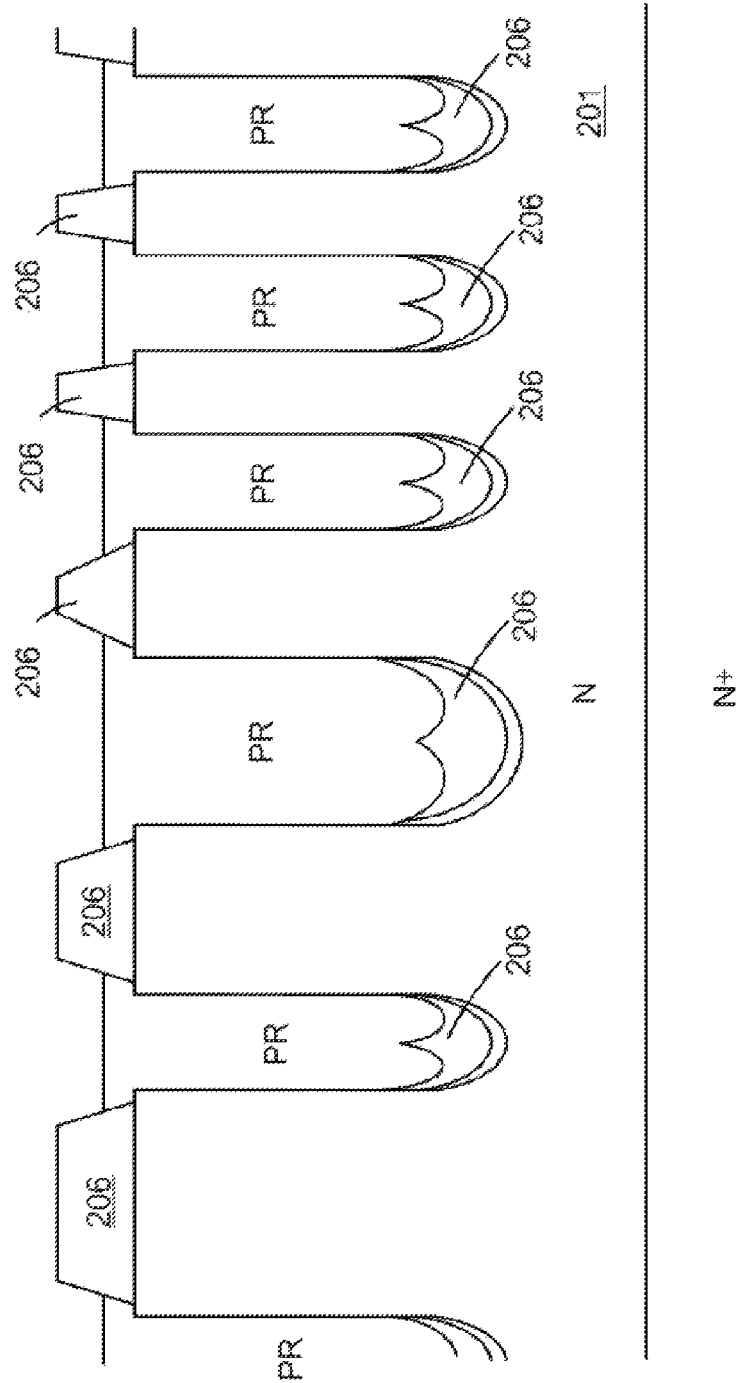

In FIG. 5D, a layer of photo resist (PR, as illustrated in FIG. 5D) is applied filling into all the trenches and covering the N epitaxial layer 201. Then, a step of blank exposure or plasma ashing is carried out to expose the portion of the HDP oxide layer 206 on mesa areas between two adjacent of those trenches. Or the photo resist is exposed with an additional oversized mask protecting the photo resist on top of those trenches.

Figure 5E:
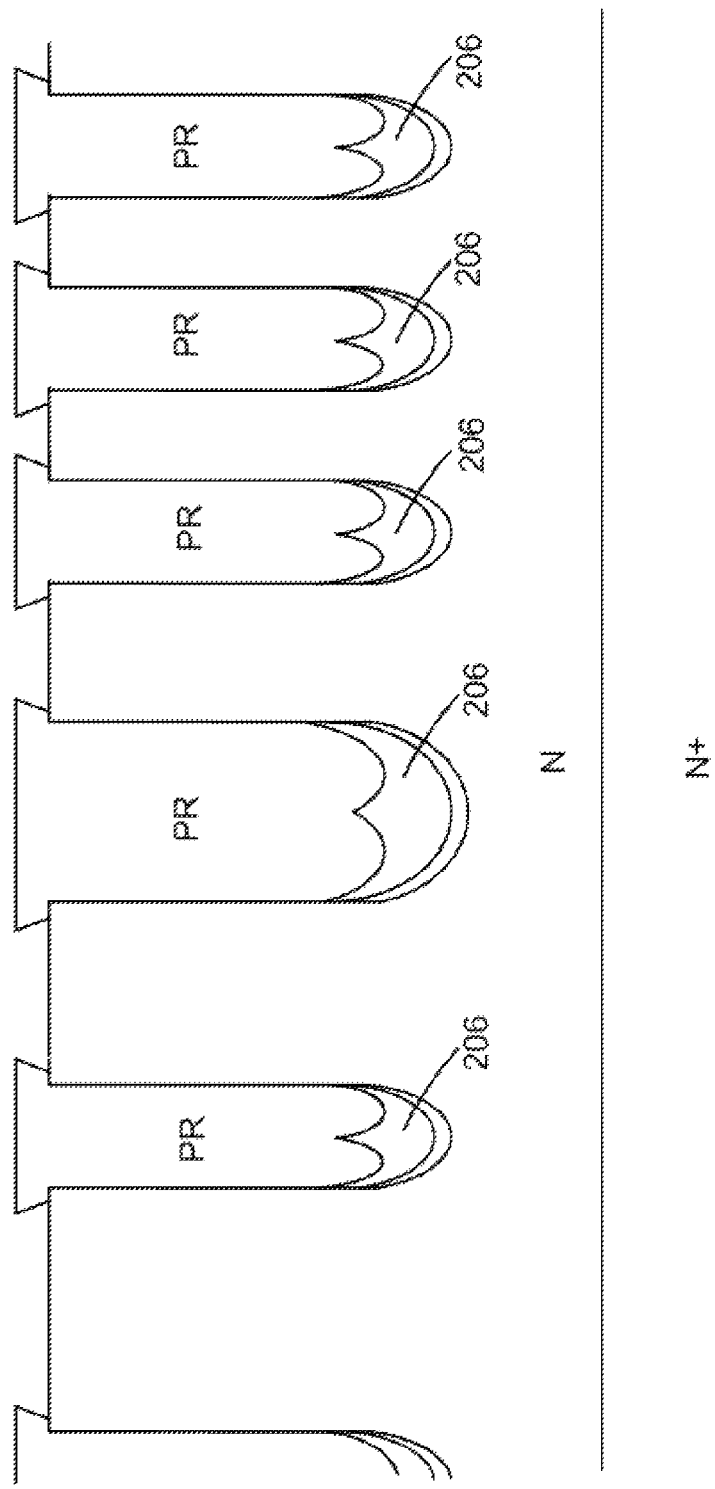
Figure 5F:
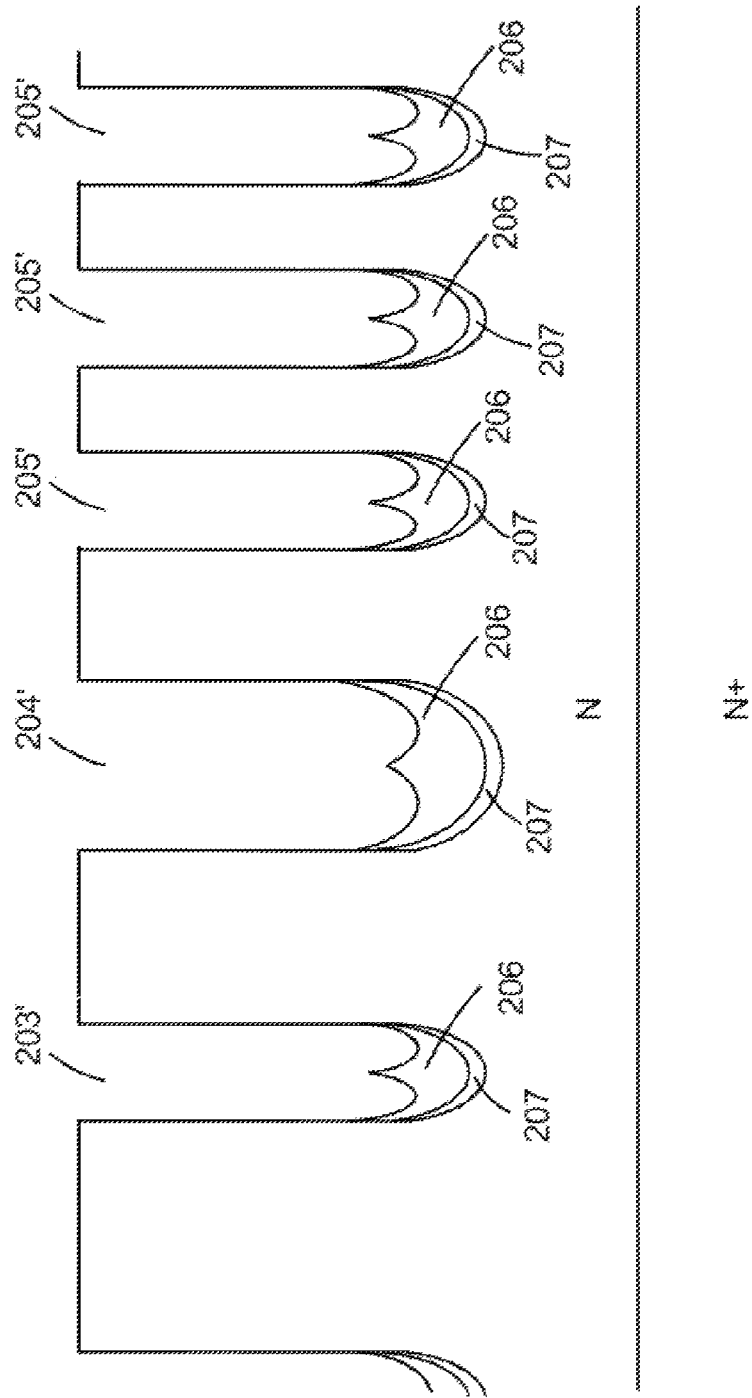

In FIG. 5E, a step of wet oxide etching is carried out to remove the portion of the HDP oxide layer 206 on the mesa areas. In FIG. 5F, after the photo resist is removed away, the thermal oxide layer 207 and the HDP oxide layer 206 is kept only onto trench bottom of the trenches 203', the wider trench 204' and the floating trenches 205'.

Figure 5G:
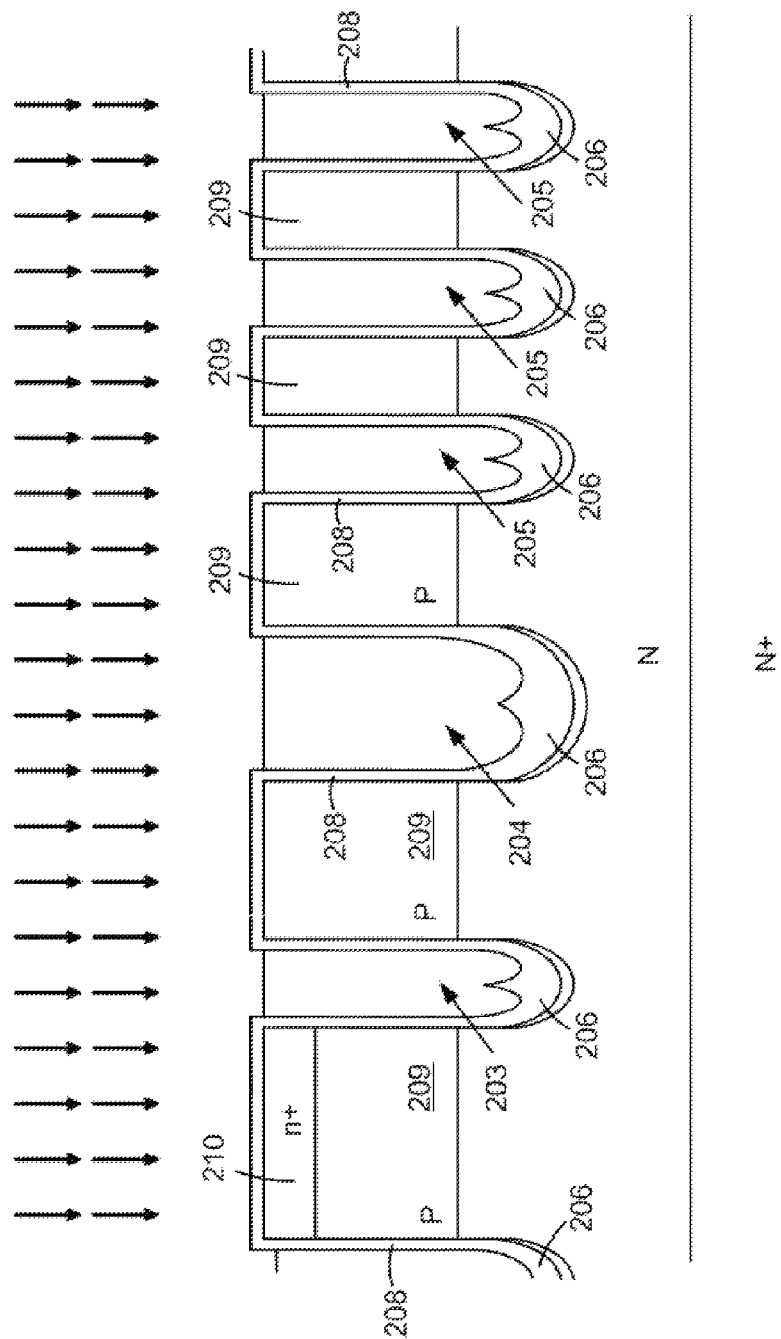

In FIG. 5G, a gate oxide layer 208 is grown or deposited onto the HDP oxide layer 206 and along trench sidewalls of those trenches and lining over the mesa areas between two adjacent of those trenches, then, a doped poly-silicon layer is deposited onto the gate oxide layer 208. After that, a dry etching or CMP (Chemical Mechanical Polishing, the same hereinafter) step is carried out to remove the portion of the doped poly-silicon layer away from a top surface of the mesa areas and to be kept only within those trenches to form a plurality of trenched gates 203, at least one wider trenched gate 204 and multiple trenched floating gates 205. As illustrated, the HDP oxide layer 206 in conjunction with the gate oxide layer 208 forms a W shape interface with the doped poly-silicon in those trenched gates. Then, a body ion implantation and a body diffusion steps are successively carried out without a body mask to form a plurality of P body regions 209 extending between every two adjacent of the trenched gates 203, the wider trenched gate 204 and the trenched floating gates 205. Next, after applying a source mask (not shown), a source ion implantation and a source diffusion step are successively carried out to form n+ source regions 210 only between two adjacent of the trenched gates 203 only within the active area.

Figure 5H:
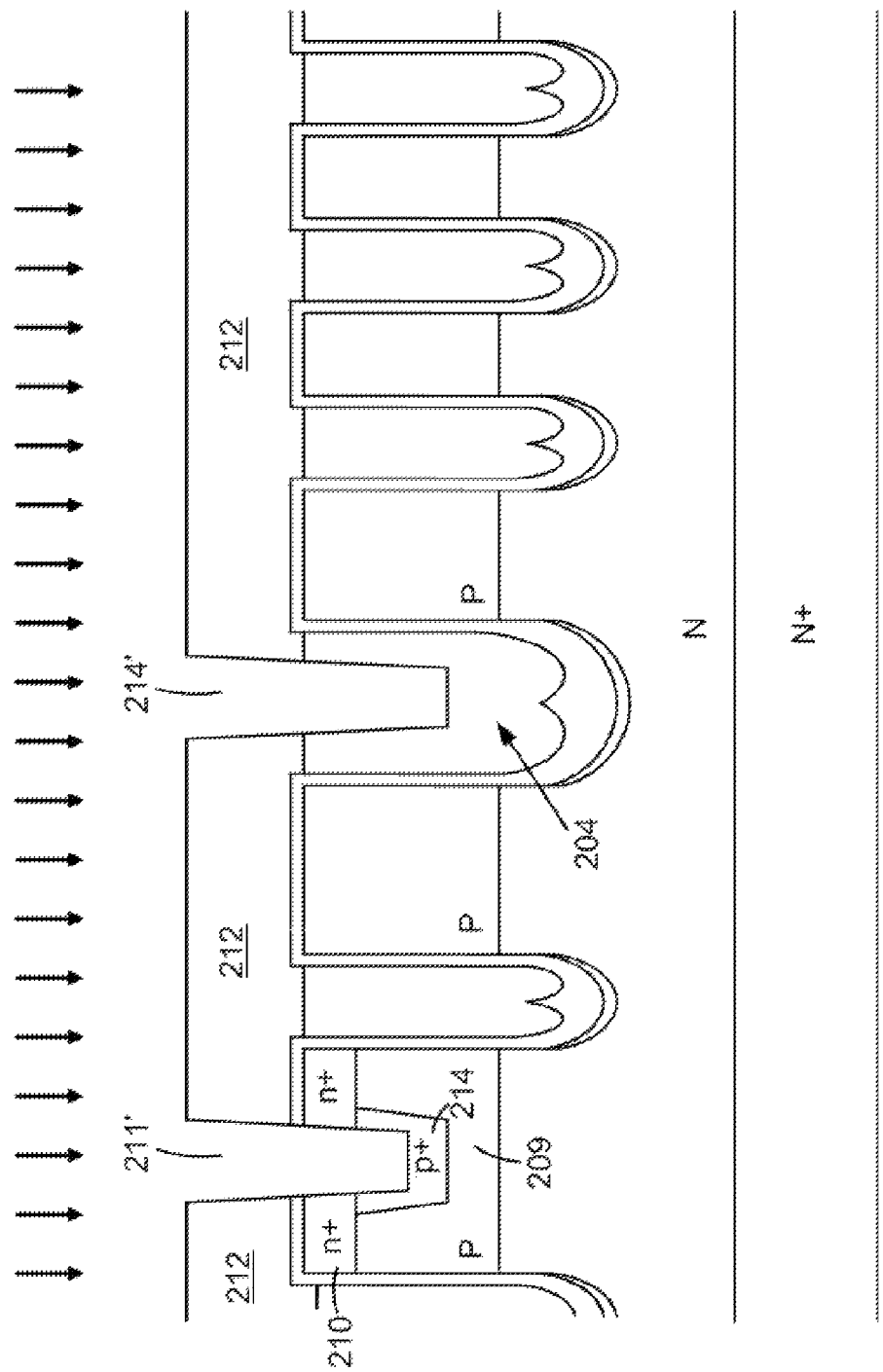

In FIG. 5H, a contact interlayer 212 is deposited covering a top surface of the whole structure. Then, after applying a contact mask (not shown), steps of oxide etching and silicon etching are successively carried out to form a source-body contact opening 211' in the active area, and to form a gate contact opening 294' in the gate contact area, wherein the source-body contact opening 211' having slope sidewalls is penetrating through the contact interlayer 212, the n+ source regions 210 and extending into the P body region 209, the gate contact opening 294' having slope sidewalls is penetrating through the contact interlayer 212 and further extending into the wider trenched gate 204. Next, a p+ ion implantation step is performed to form a p+ ohmic body contact region 214 within the P body region 209 while wrapping around bottom and sidewalls of the source-body contact opening 211' underneath the n+ source region 210.

Figure 5I:
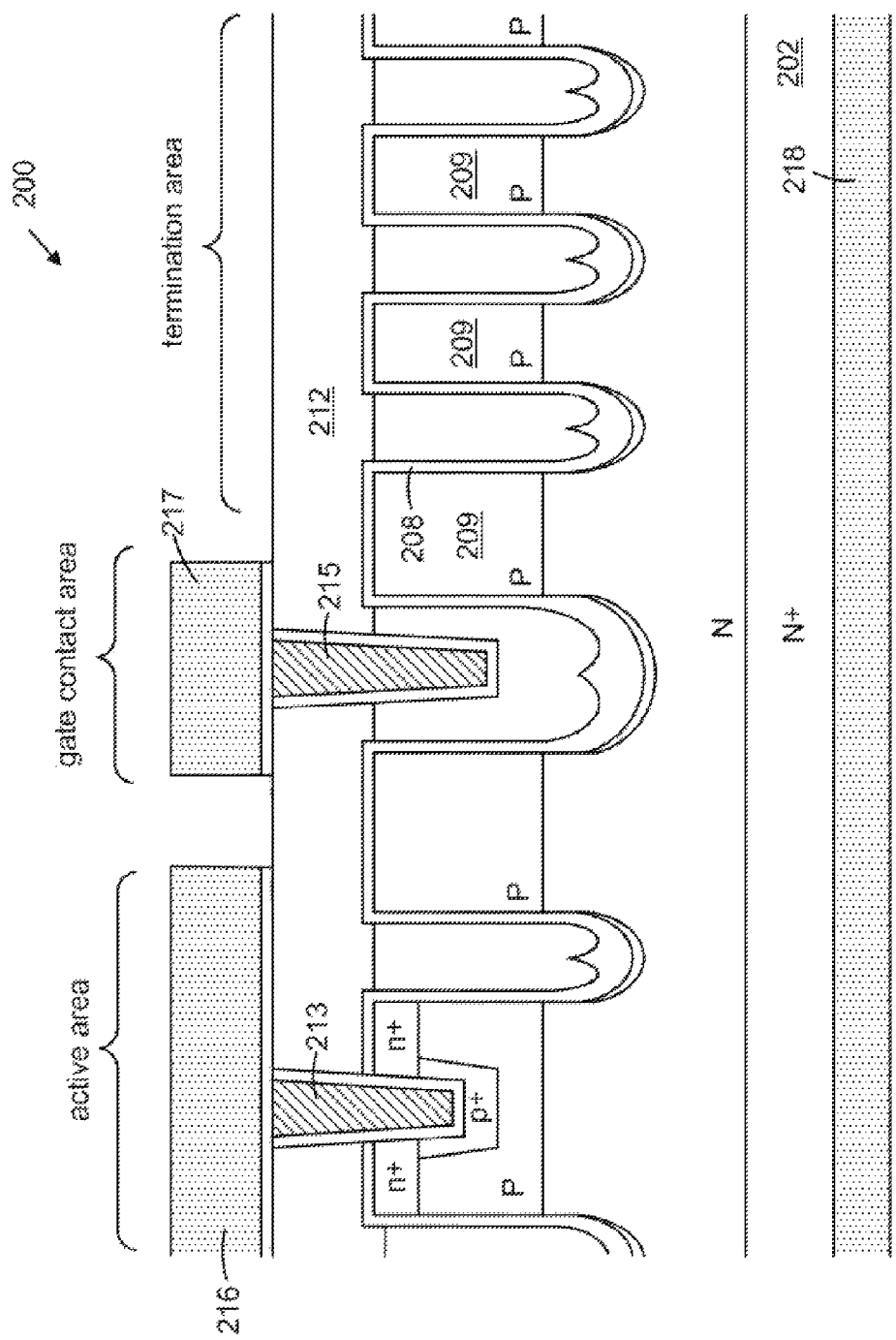

In FIG. 5I, a barrier layer of Ti/TiN or Co/TiN or Ta/TiN is deposited along an inner surface of the source-body contact opening and the gate contact opening, then, a tungsten metal layer is deposited onto the barrier layer. After that, the tungsten metal layer and the barrier layer are successively etched back to be kept within the source-body contact opening and the gate contact opening to serve as tungsten metal plug 213 and 215 respectively for a trenched source-body contact structure 211 and a trenched gate contact structure 294. Next, onto the contact interlayer 212, an Al alloys layer optionally padded by a resistance-reduction layer of Ti or T/TiN is deposited and then patterned into a source metal 216 and a gate metal 217 by using a metal mask. The source metal 216 is electrically contacting with the tungsten metal plug 213 and the gate metal 217 is electrically contacting with the tungsten metal plug 215. Then, after grinding the rear side of the N+ substrate 202, a back metal is deposited thereon to serve as drain electrode 218 for the trench MOSFET 200.

Figure 6A:
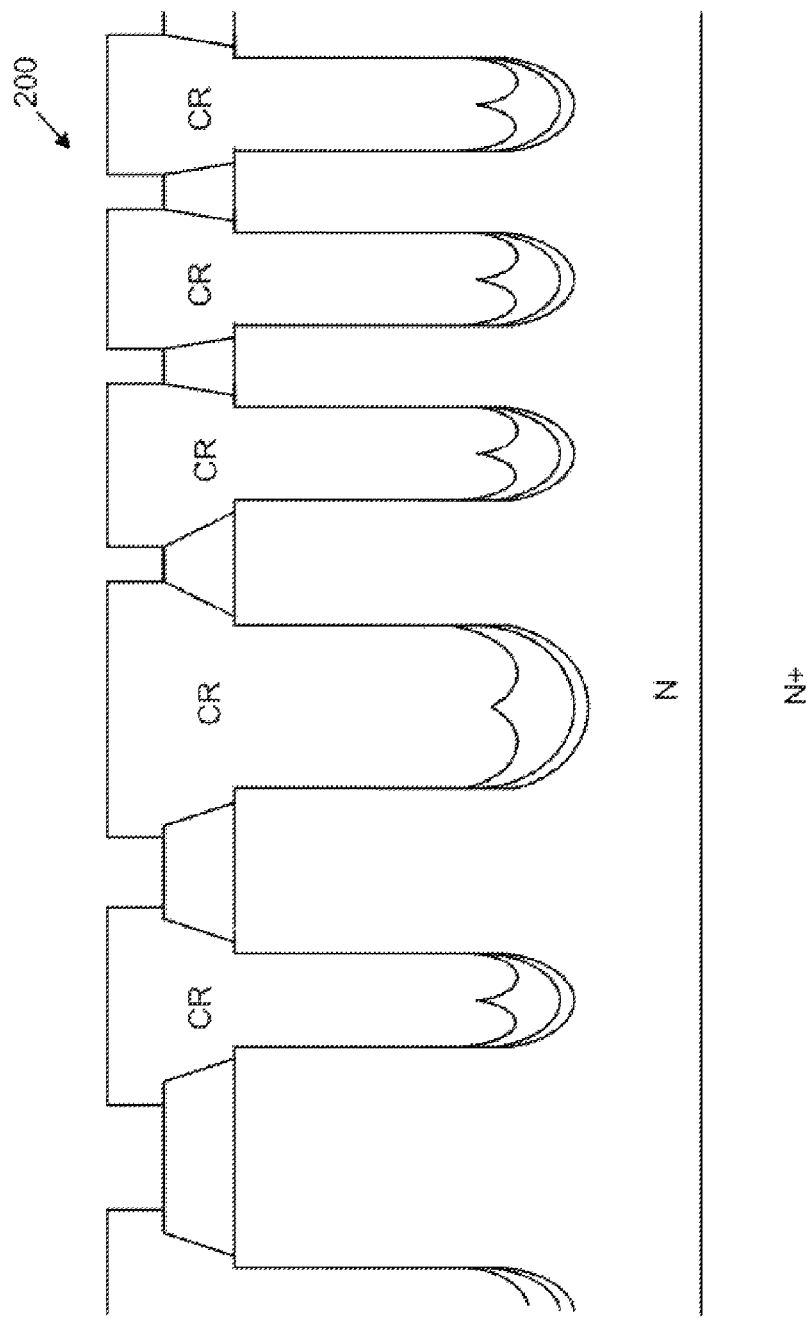
FIGS. 6A~6B are a serial of side cross-sectional views for showing another method for fabricating the trench MOSFET as shown in FIG. 2A.
Figure 6B:
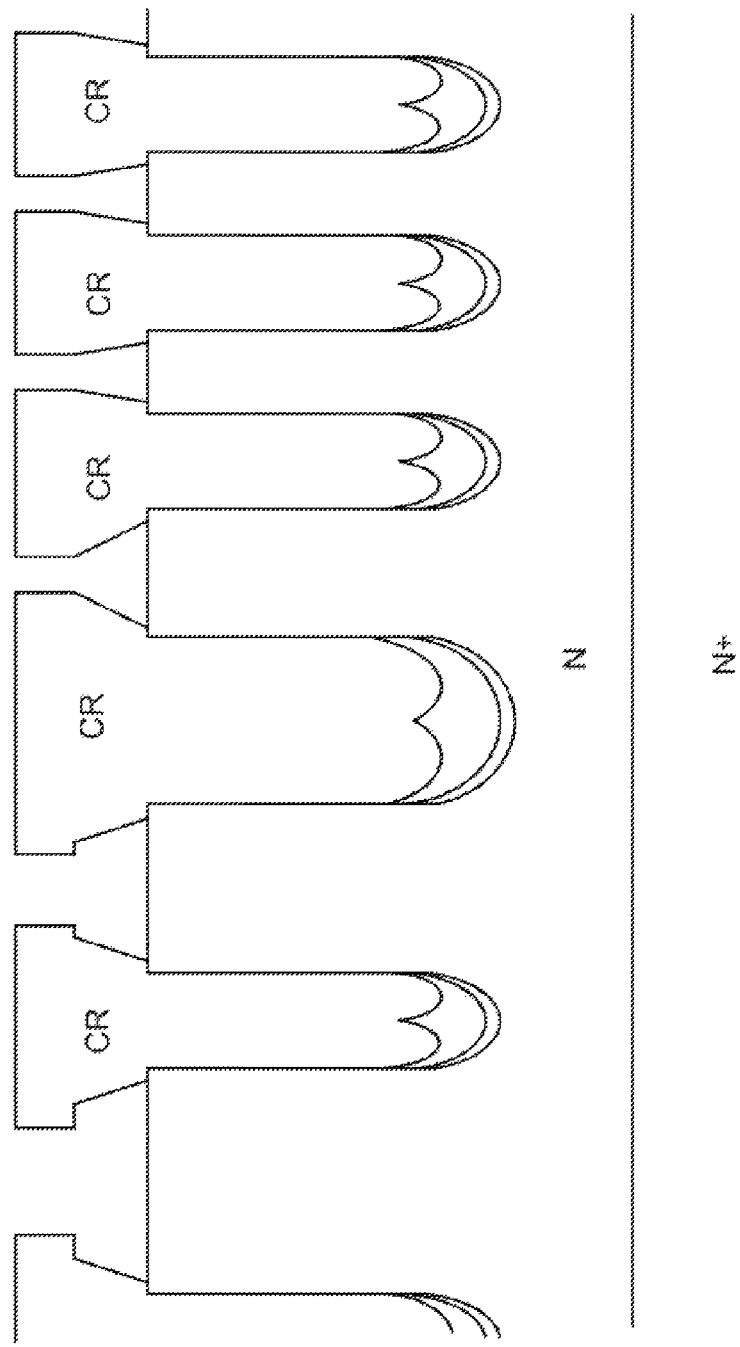

FIGS. 6A and 6B show some exemplary steps that show another method to remove the thermal oxide layer and the HDP oxide layer on the top surface of the mesa areas while making the trench MOSFET 200 in FIG. 2A. In FIG. 6A, after removing the portion of the HDP oxide layer and the thermal oxide layer along sidewalls of those trenches, a coat resist (CR, as illustrated in FIG. 6A) is applied filling into those trenches and covering a top surface of the N epitaxial layer.

Then, after applying a TBO (trench bottom oxide) mask (not shown) onto the coat resistance, a step of exposure and developing is carried out to open up portion of the HDP oxide layer on the top surface of the mesa areas.

In FIG. 6B, a wet oxide etching is carried out to remove away the portion of the HDP oxide layer from the top surface of the mesa areas.

Figure 7A:
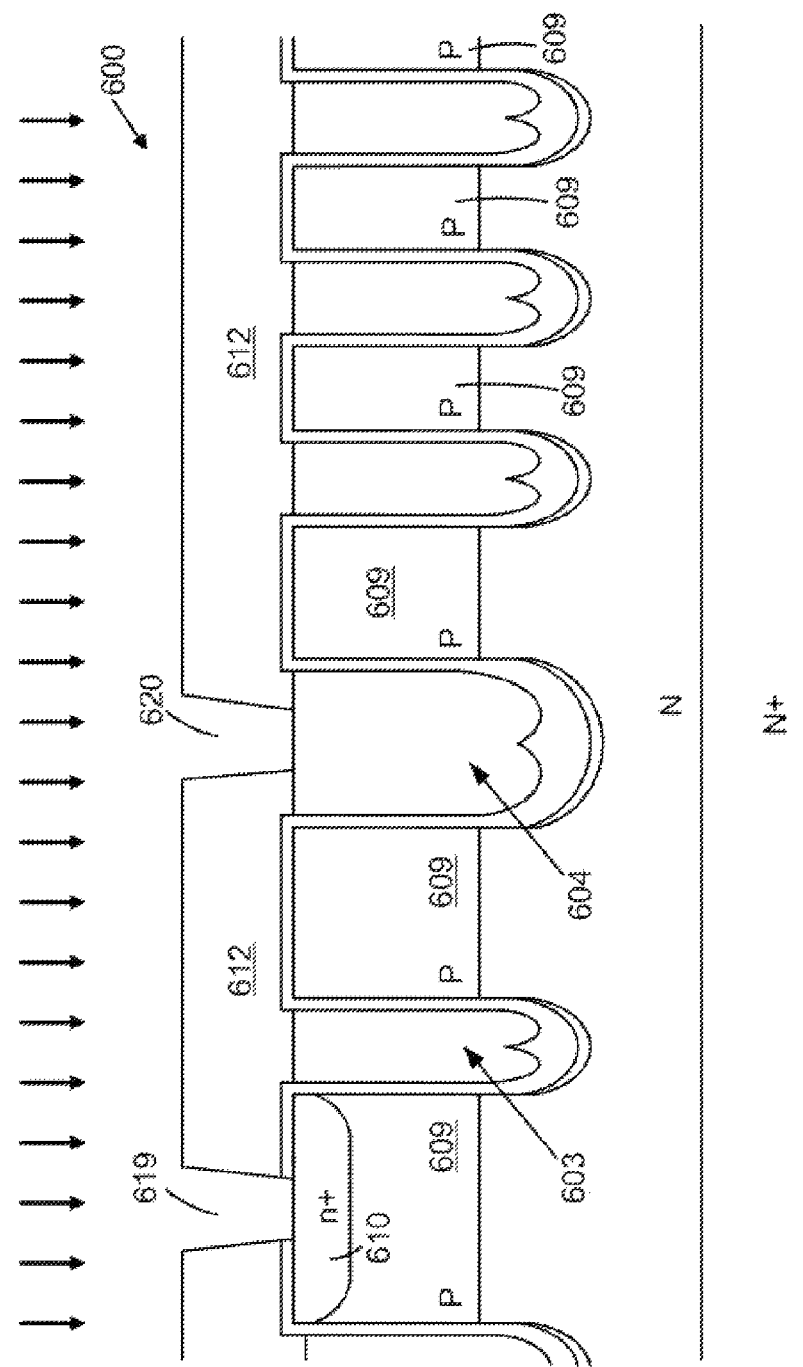
FIGS. 7A~7B are a serial of side cross-sectional views for showing the processing steps for fabricating the trench MOSFET as shown in FIG. 4.
Figure 7B:
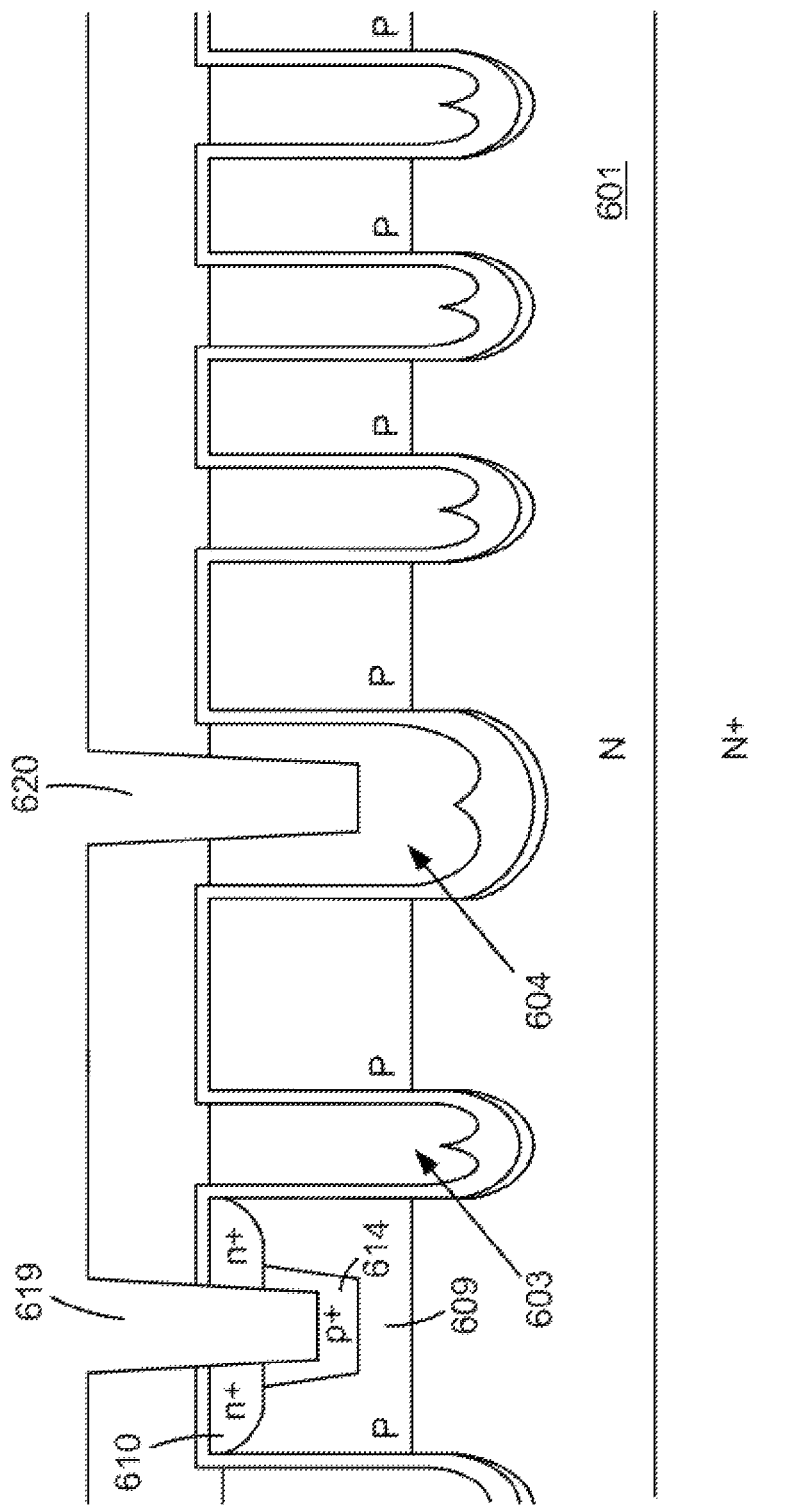

FIGS. 7A and 7B show some exemplary steps that are performed to form the preferred N-channel trench MOSFET 600 in FIG. 4 by using 3 masks. In FIG. 7A, after formation of the P body region 609, a contact interlayer 612 is firstly formed covering the trench MOSFET 600, then, after applying a contact mask (not shown), the contact interlayer 612 is etched by dry oxide etching to form a source-body contact opening 619 and a gate contact opening 620 as illustrated. Then, a source ion implantation and a source diffusion step are carried out successively without using a source mask to form n+ source regions 610. In FIG. 7B, by performing a dry silicon etching step, the source-body contact opening 619 is etched to further penetrate through the n+ source regions 610 and extend into P body region 609, the gate contact opening 620 is etched to further extend into the wider trenched gate 604. As the n+ source regions 610 are formed by the source diffusion step from a center portion between two adjacent of the trenched gates 603 to channel regions near sidewalls of the trenched gates 603, the n+ source regions 610 have a doping concentration along the channel regions lower than along the source-body contact opening 619 at a same distance from the top surface of the N epitaxial layer 601, and have a junction depth along the channel regions shallower than along the source-body contact opening 619. Then, a p+ ion implantation is carried out to form the p+ ohmic body contact region 614 wrapping around bottom and sidewalls of the source-body contact opening 619 in the P body region 609.

Figure 8:
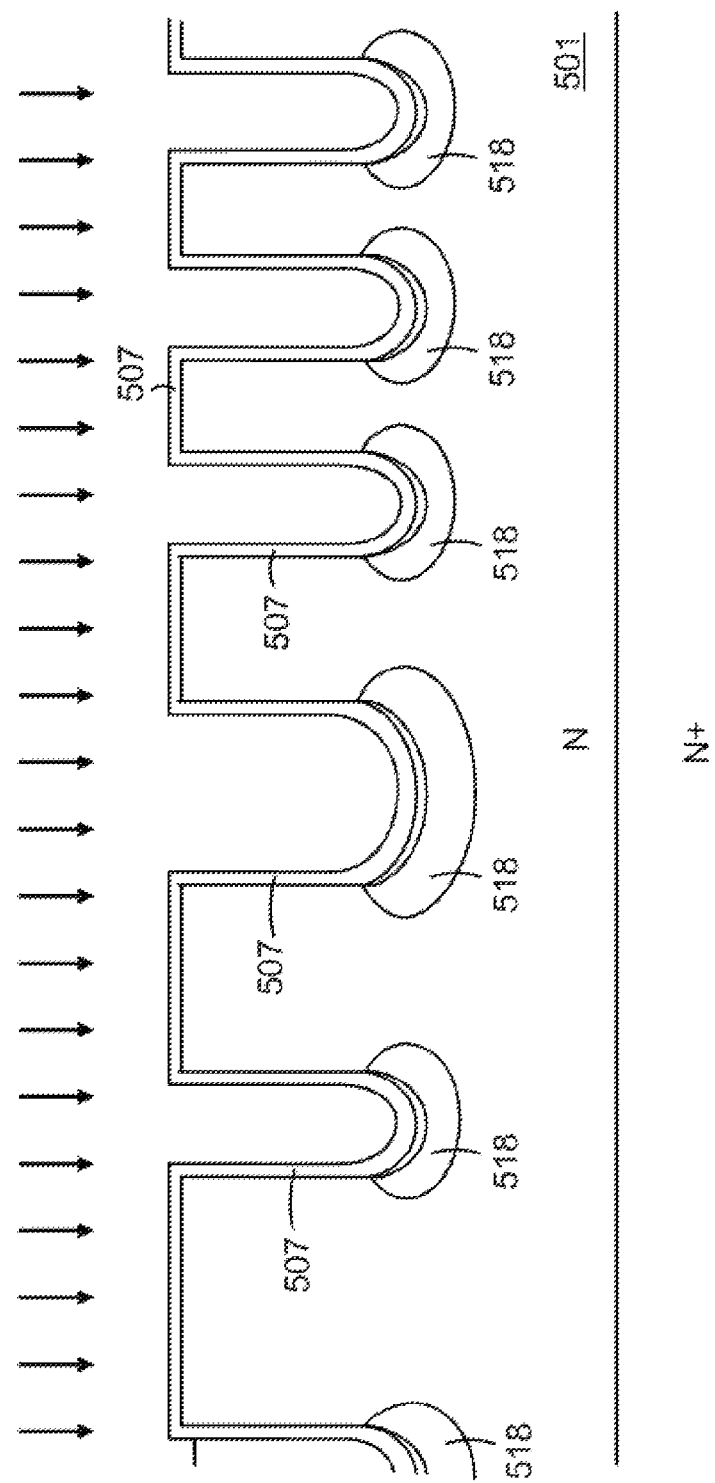
FIG. 8 is a cross-sectional view for showing one of the processing steps for fabricating the trench MOSFET as shown in FIGS. 3A and 3B.

FIG. 8 shows an exemplary step for formation of the n* on-resistance reduction doped region 518 while fabricating the preferred N-channel trench MOSFET 500 in FIG. 3B. After the formation of the thermal oxide layer 507, an n type dopant ion implantation is carried out to form the n* on-resistance reduction doped region 518 surrounding bottom of all the trenches formed in the N epitaxial layer 501.

Figure 9A:
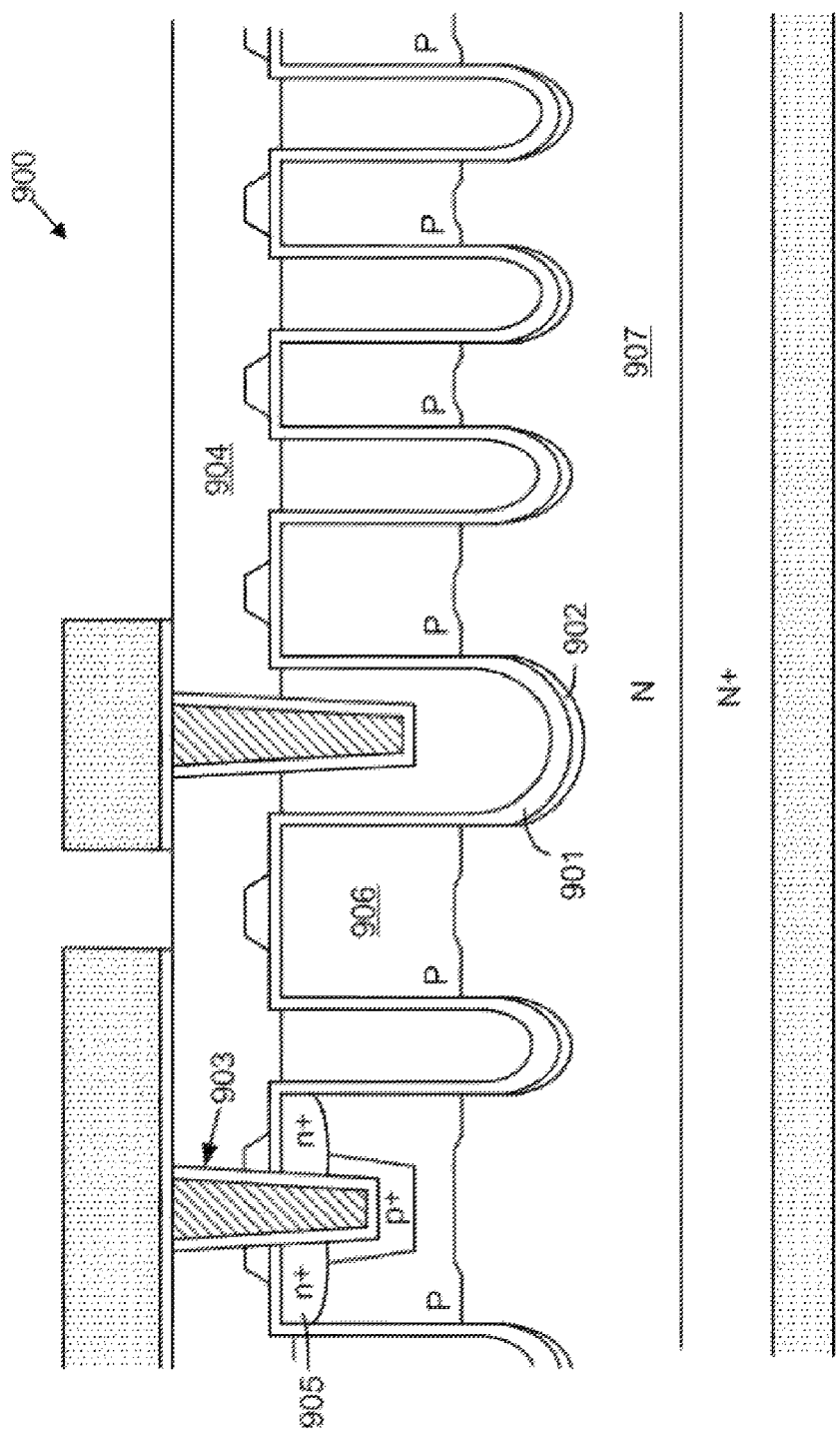
FIG. 9A is a cross-sectional view of another preferred embodiment according to the present invention.

Please refer to FIG. 9A for another preferred N-channel trench MOSFET 900 with composite trench bottom oxide for reduction of gate charge according to the present invention. The N-channel trench MOSFET 900 has a similar structure to the N-channel trench MOSFET 300 in FIG. 2B except that, a HDP oxide layer 901 padded with a thermal oxide layer 902 formed on a bottom surface of all the trenches and a top surface of mesa areas between every two of all the trenched gates, correspondingly, a plurality of trenched source-body contact structures 903 penetrates through a contact interlayer 904, the HDP oxide layer 901, the thermal oxide layer 902 and n+ source regions 905, and further extends into P body regions 906. Therefore, the device structure in FIG. 9A makes process simple without requiring additional mask or photolithography to remove the HDP oxide layer on the top surface of the mesas by wet etch before formation of P body regions 906. Moreover, the n+ source regions 905 have a doping concentration along the trenched source-body contact structures 903 higher than along adjacent channel regions at a same distance from the top surface of the N epitaxial layer 907, and the n+ source regions 905 have a junction depth along the trenched source-body contact structures 903 deeper than along the adjacent channel regions.

Figure 9B:
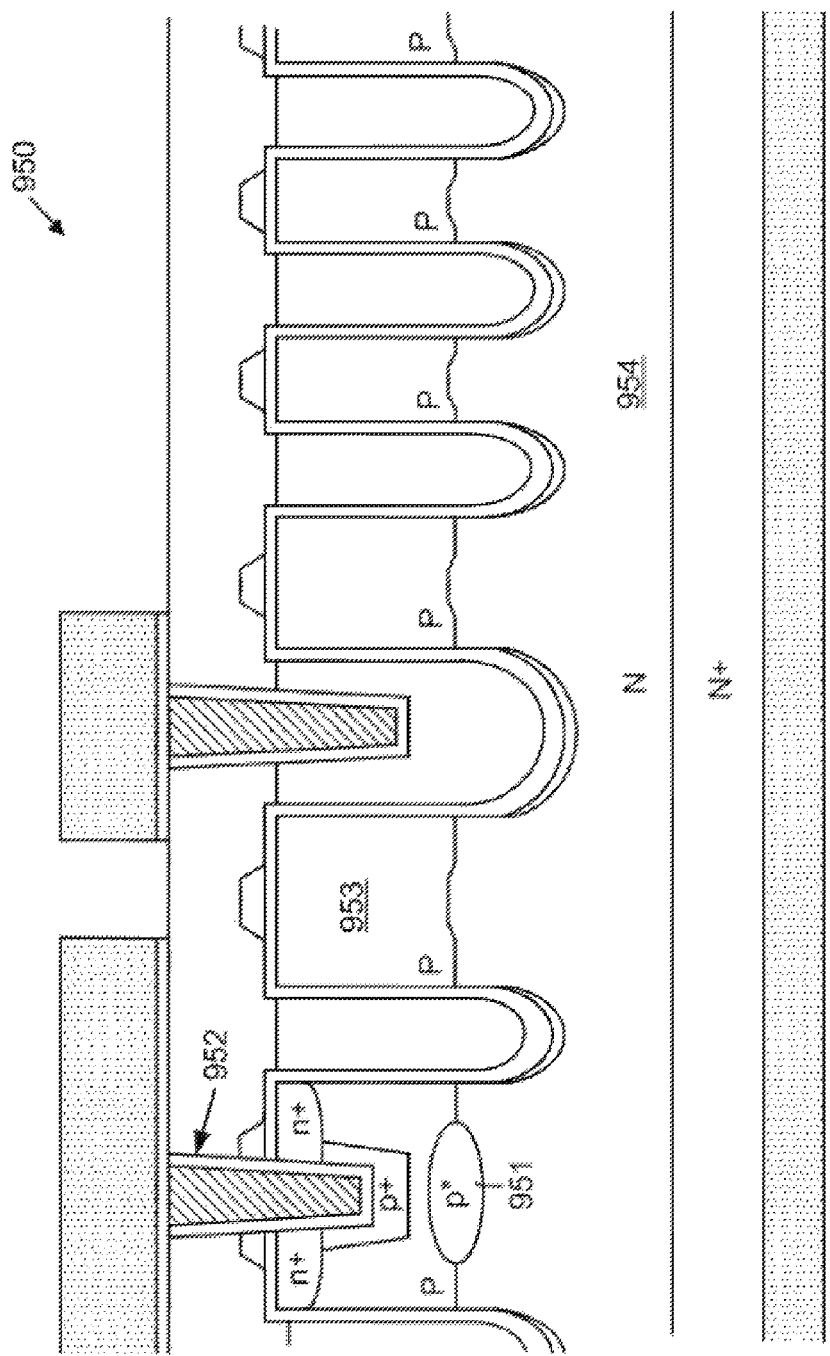
FIG. 9B is a cross-sectional view of another preferred embodiment according to the present invention.

Please refer to FIG. 9B for another preferred N-channel trench MOSFET 950 with composite trench bottom oxide for reduction of gate charge according to the present invention.

The N-channel trench MOSFET 950 has a similar structure to the N-channel trench MOSFET 900 in FIG. 9A except that, at least one UIS enhancement p* region 951 is formed under the trenched source-body contact structure 952, wherein a portion of the UIS enhancement p* region 951 is formed in the P body region 953, while the other portion is formed in the N epitaxial layer 954.

Figure 10A:
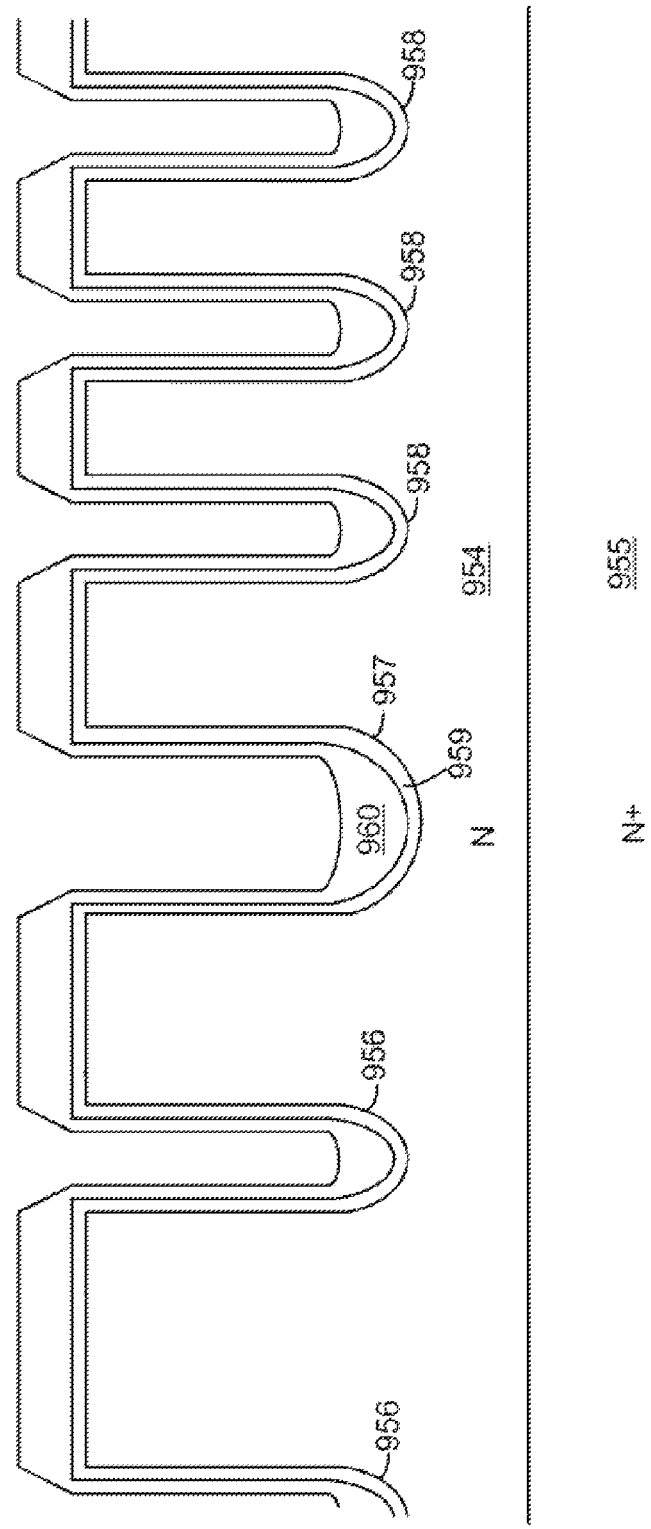
FIGS. 10A~10F are a serial of side cross-sectional views for showing the processing steps for fabricating the trench MOSFET as shown in FIG. 9B.

FIGS. 10A to 10F are a serial of exemplary steps that are performed to form the preferred N-channel trench MOSFET 950 in FIG. 9B by using three masks. In FIG. 10A, an N epitaxial layer 954 is grown on an N+ substrate 955, for example, a red phosphorus substrate. Then, after applying a trench mask (not shown) onto the N epitaxial layer 954, a step of silicon etching is performed to form a plurality of trenches extending from a top surface of the N epitaxial layer 954, including: a plurality of trenches 956 in an active area, at least one wider trench 957 in a gate contact area and multiple floating trenches 958 in a termination area, among those trenches, the wider trench 957 in the gate contact area has a trench width greater than the trenches 956 in the active area. After that, a sacrificial oxide layer (not shown) is applied and then removed to eliminate the plasma damage introduced while etching those trenches. Then, a thermal oxide layer 959 is formed along sidewalls and bottoms of all the trenches and lining the top surface of the N epitaxial layer 954. Afterwards, a HDP oxide layer 960 is deposited onto the thermal oxide layer 959 and a step of densification is performed.

Figure 10B:
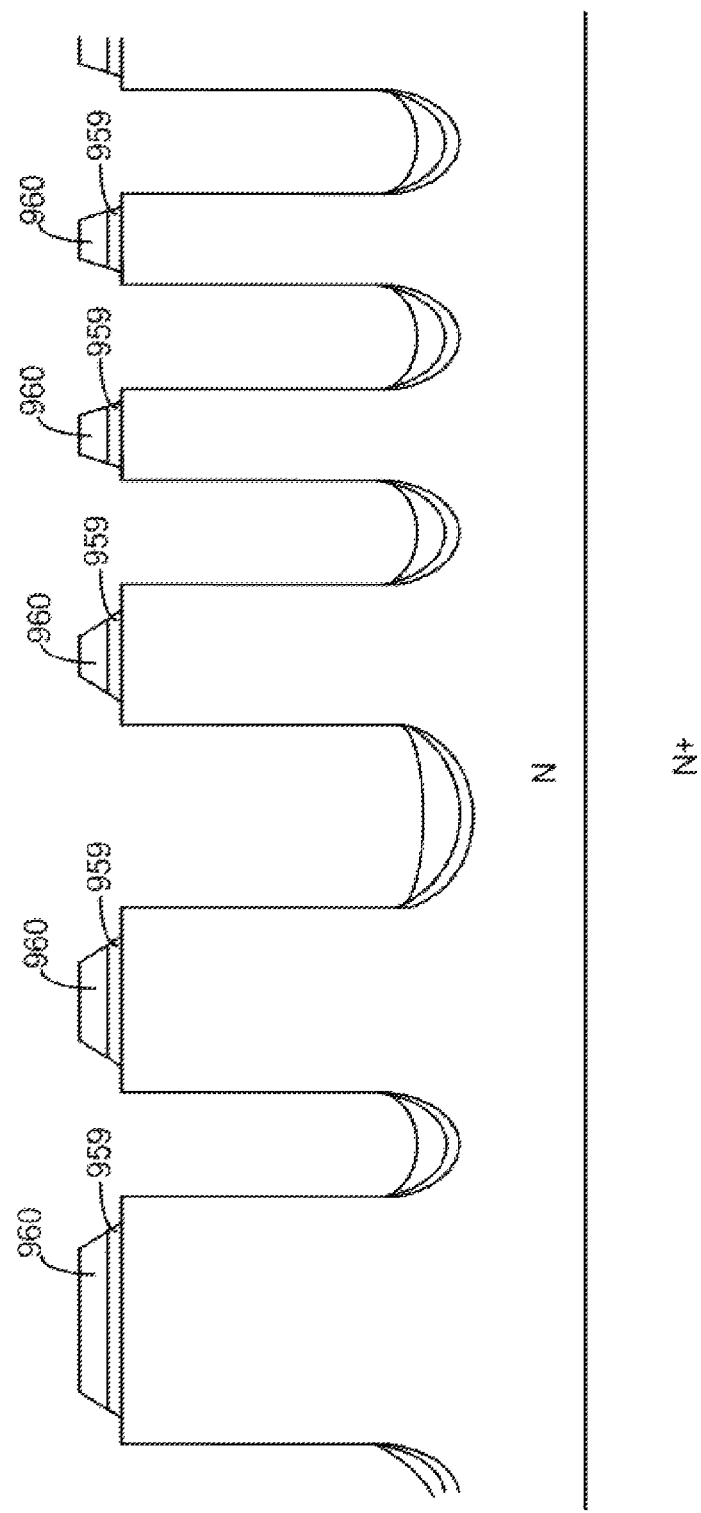

In FIG. 10B, a wet oxide etching is carried out to remove the oxide layer on trench sidewalls of all the trenches, including the portion of the thermal oxide layer 959 and the HDP oxide layer 960 on trench sidewalls, while keep the portion of the thermal oxide layer 959 and the HDP oxide layer 960 on trench bottom and mesa areas between every two of all the trenches still.

Figure 10C:
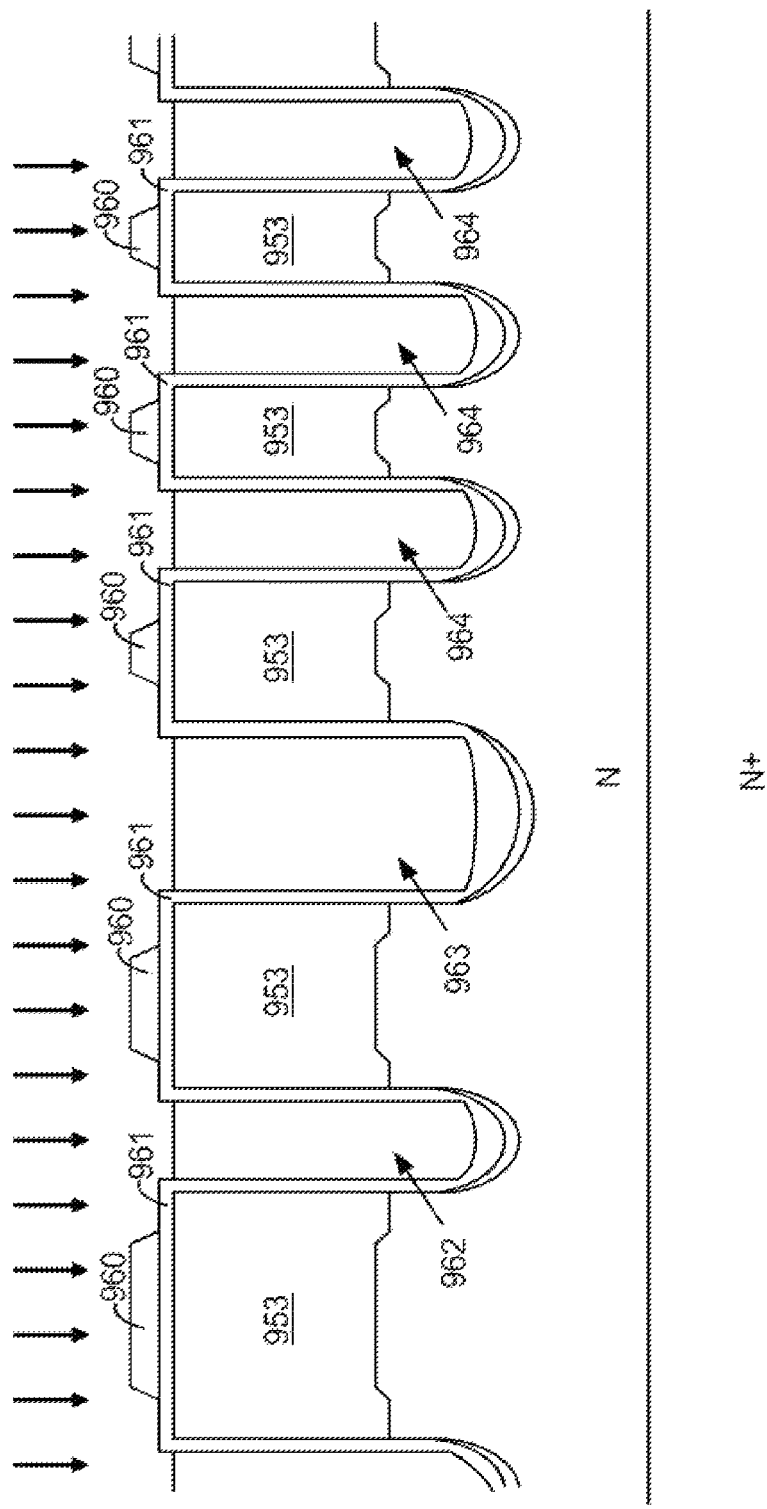

In FIG. 10C, a gate oxide layer 961 is grown or deposited onto the HDP oxide layer 960 and along trench sidewalls of those trenches and lining over the mesa areas between two adjacent of those trenches, then, a doped poly-silicon layer is deposited onto the gate oxide layer 961. After that, a dry etching or CMP step is carried out to remove the portion of the doped poly-silicon layer away from the top surface of the mesa areas and to be kept only within those trenches to form a plurality of trenched gates 962, at least one wider trenched gate 963 and multiple trenched floating gates 964. As illustrated, the HDP oxide layer 960 in conjunction with the gate oxide layer 961 forms a W shape interface with the doped poly-silicon in those trenched gates. Then, a body ion implantation and a body diffusion steps are successively carried out without a body mask to form a plurality of P body regions 953 extending between every two adjacent of the trenched gates 962, the wider trenched gate 963 and the trenched floating gates 964.

Figure 10D:
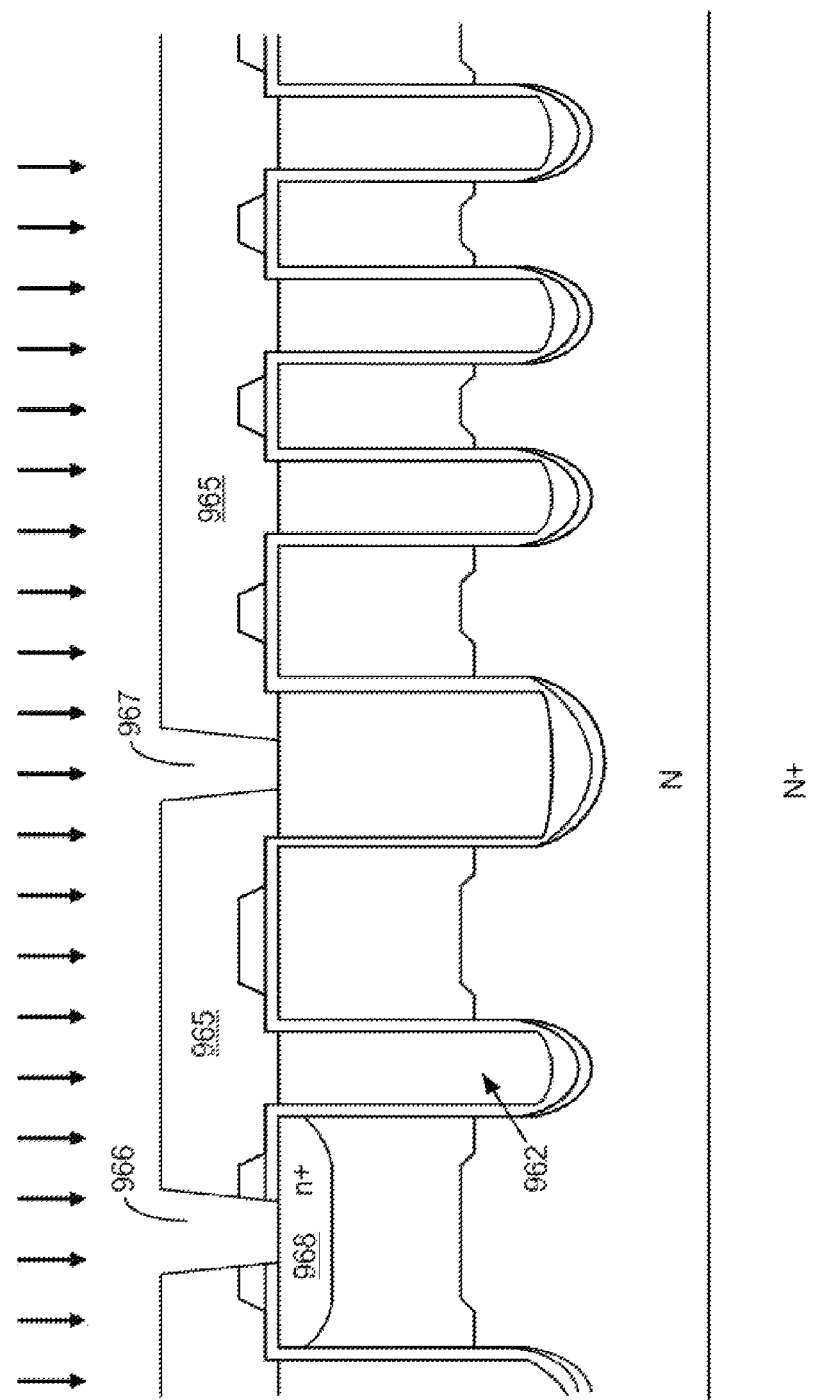

In FIG. 10D, a contact interlayer 965 is deposited covering a top surface of the whole structure. Then, after applying a contact mask (not shown), a step of dry oxide etching is carried out to form a source-body contact opening 966 in the active area, and to form a gate contact opening 967 in the gate contact area, wherein the source-body contact opening 966 and the gate contact opening 967 having slope sidewalls are penetrating through the contact interlayer 965. Next, a source ion implantation and a source diffusion step are successively carried out to form n+ source regions 968 only between two adjacent of the trenched gates 962 only within the active area without using a source mask.

Figure 10E:
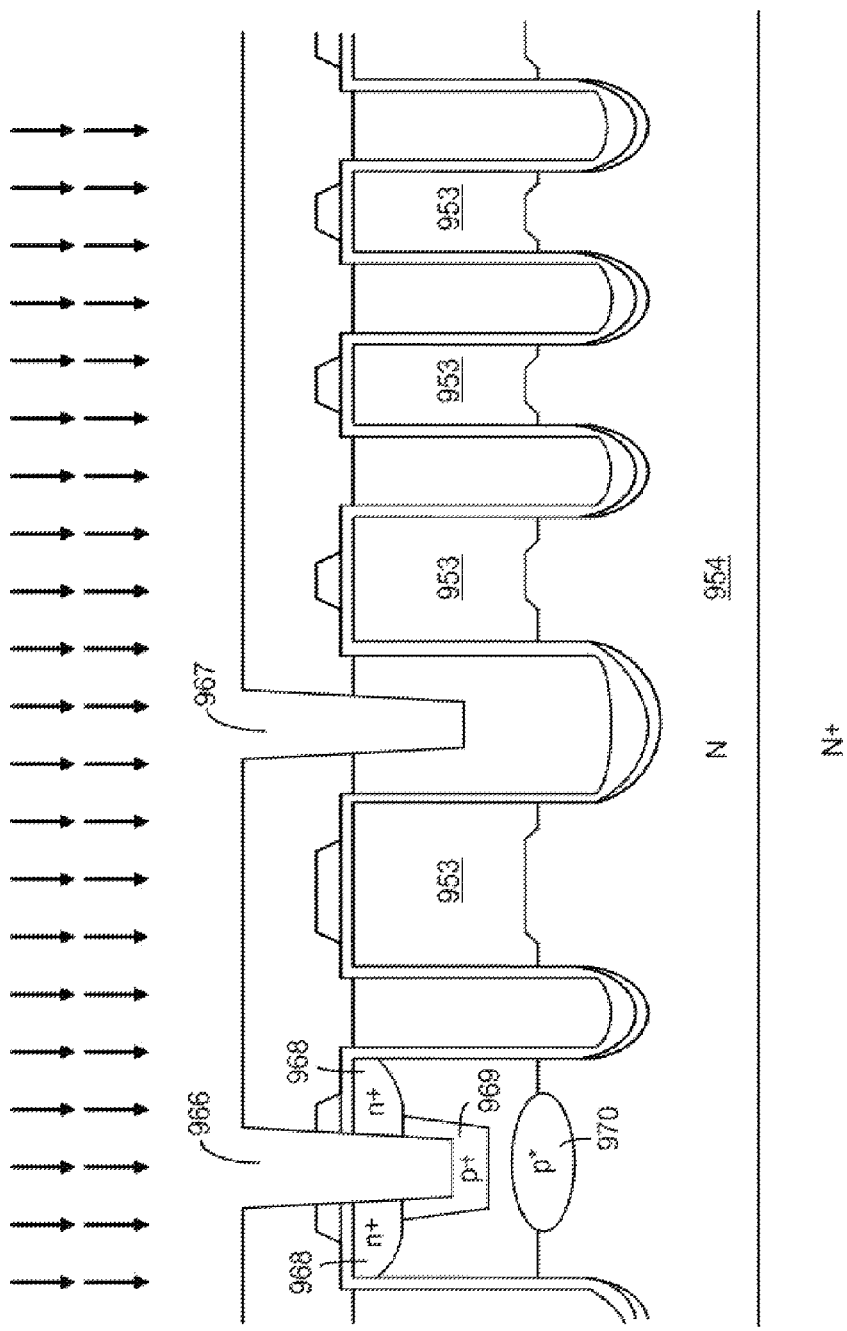

In FIG. 10E, a silicon etching process is performed to make the source-body contact opening 966 further through the n+ source regions 968 and extending into the P body region 953, and the gate contact opening 967 further extending into the wider trenched gate 963. Then, a p+ ion implantation with BF2 is performed to form a p+ ohmic body contact region 969 within the P body region 953 while wrapping around bottom and sidewalls of the source-body contact opening 966 underneath the n+ source region 968. Afterwards, a p* ion implantation with boron is performed to form at least one p* UIS enhancement region 970 under the p+ ohmic body contact region 969 and followed by a rapid thermal anneal step, wherein a portion of the p* UIS enhancement region 970 is formed in the P body region 953, and the other portion of the p* UIS enhancement region 970 is formed in the N epitaxial layer 954.

Figure 10F:
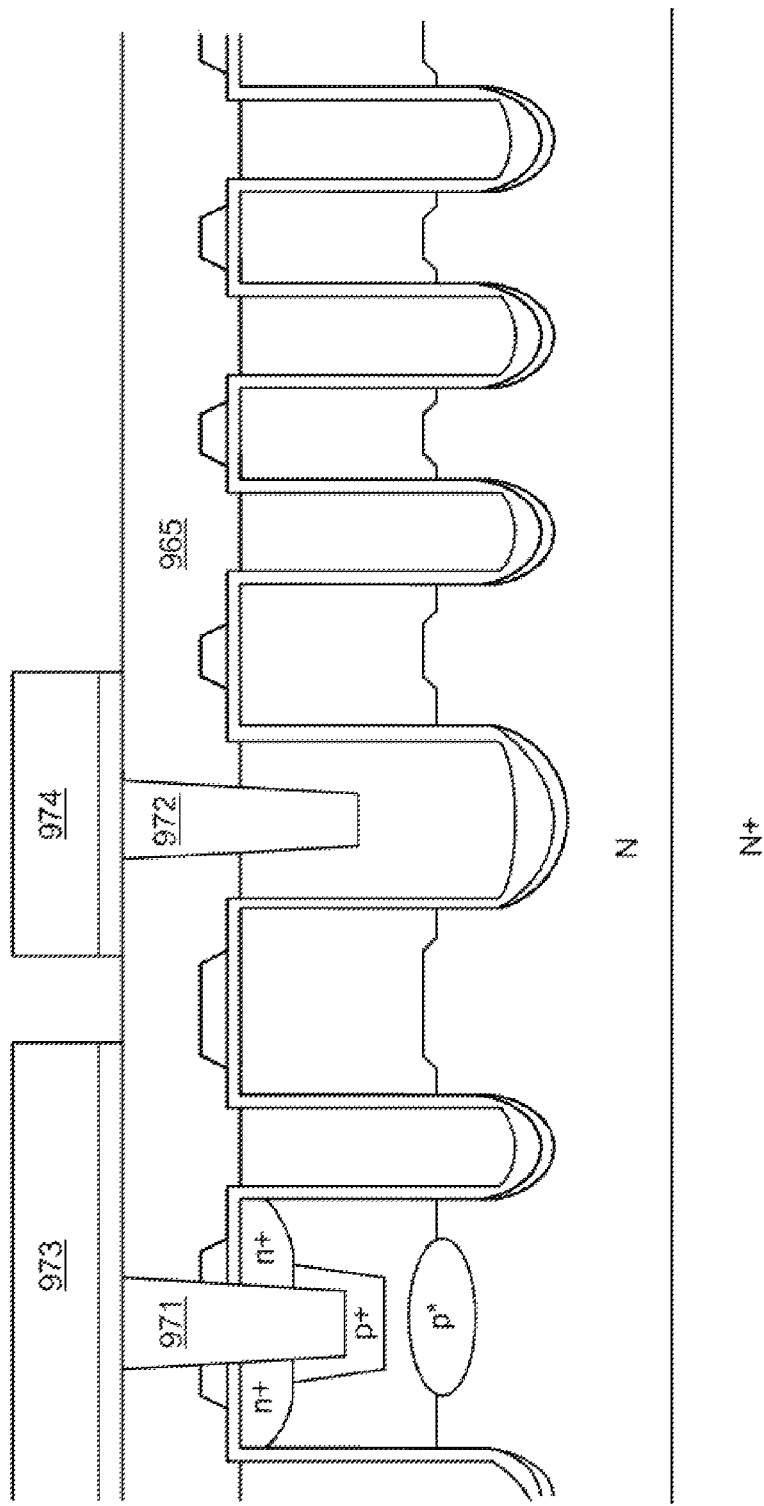

In FIG. 10F, a barrier layer of Ti/TiN or Co/TiN or Ta/TiN is deposited along an inner surface of the source-body contact opening 966 and the gate contact opening 967, then, a tungsten metal layer is deposited onto the barrier layer. After that, the tungsten metal layer and the barrier layer are successively etched back to be kept within the source-body contact opening 966 and the gate contact opening 967 to serve as tungsten metal plug padded with the barrier 971 and 972 respectively for a trenched source-body contact structure and a trenched gate contact structure. Next, onto the contact interlayer 965, an Al alloys layer optionally padded by a resistance-reduction layer of Ti or T/TiN is deposited and then patterned into a source metal 973 and a gate metal 974 by using a metal mask. The source metal 973 is electrically contacting with the tungsten metal plug 971 and the gate metal 974 is electrically contacting with the tungsten metal plug 972.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A semiconductor power device comprising:
   a plurality of transistor cells disposed in an active area near a top surface of an epitaxial layer of a first conductivity type grown on a semiconductor substrate of said first conductivity type wherein each of said transistor cells is surrounded by trenched gates, said trenched gates being surrounded by source regions of said first conductivity type encompassed in body regions of a second conductivity type and extending into said epitaxial layer;
   multiple trenched floating gates disposed in a termination area without having said source regions, surrounding said active area and each of said trenched floating gates having a floating voltage wherein said trenched floating gates are penetrating through said body regions and extending into said epitaxial layer;
   at least one wider trenched gate in a gate contact area, having a greater trench width than said trenched gates and electrically connecting said trenched gates in said active area to a gate metal;
   a HDP (High-Density Plasma) oxide layer padded with a thermal oxide layer formed on bottom surfaces of said trenched gates, said at least one wider trenched gate and said trenched floating gates and top surface of said mesa areas between two adjacent of said trenched gate; and
   a plurality of trenched source-body contact structures penetrating through a contact interlayer, said HDP oxide layer, said thermal oxide layer and said source regions, and extending into said body regions in said transistor cells in said active area, each of said trenched source-body contact structures being filled with a contact metal plug for electrically connecting said source region and said body region to a source metal.

2. The semiconductor power device of claim 1 further comprising at least one UIS enhancement region of said second conductivity type formed under said trenched source-body contact structures in said transistor cells.

3. The semiconductor power device of claim 1 further comprising at least one trenched gate contact structure penetrating through said contact interlayer and extending into said wider trenched gate, wherein said trenched gate contacts structure is filled with said contact metal plug.

4. The semiconductor power device of claim 1 wherein said contact metal plug can be implemented by a tungsten plug padded by a barrier metal layer of Ti/TiN or Co/TiN or Ta/TiN.

5. The semiconductor power device of claim 1 further comprising a ohmic body contact region of said second conductivity type formed at least wrapping around each bottom of said trenched source-body contact structures, said ohmic body contact region having a doping concentration higher than said body regions.

6. The semiconductor power device of claim 1 wherein said source regions have a doping concentration along said trenched source-body contact structures higher than along adjacent channel regions at a same distance from the top surface of said epitaxial layer, and said source regions have a junction depth along said trenched source-body contact structures deeper than along said adjacent channel regions.

7. The semiconductor power device of claim 1 wherein said transistor cells are N-channel MOSFET cells.

8. The semiconductor power device of claim 1 wherein said transistor cells are P-channel MOSFET cells.

* * * * *